US011088663B2

(12) United States Patent
Ishihara et al.

(10) Patent No.: US 11,088,663 B2
(45) Date of Patent: Aug. 10, 2021

(54) POWER AMPLIFIER CIRCUIT

(71) Applicant: Murata Manufacturing Co., Ltd., Kyoto (JP)

(72) Inventors: Shota Ishihara, Kyoto (JP); Hiroshi Okabe, Kyoto (JP); Yasuhisa Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 43 days.

(21) Appl. No.: 16/168,977

(22) Filed: Oct. 24, 2018

(65) Prior Publication Data

US 2019/0131941 A1    May 2, 2019

(30) Foreign Application Priority Data

Oct. 31, 2017   (JP) .............................. JP2017-211126

(51) Int. Cl.
| | |
|---|---|
| *H03F 3/68* | (2006.01) |
| *H03F 3/191* | (2006.01) |
| *H03F 3/24* | (2006.01) |
| *H03F 3/195* | (2006.01) |
| *H03F 1/56* | (2006.01) |

(52) U.S. Cl.
CPC ............. *H03F 3/245* (2013.01); *H03F 1/565* (2013.01); *H03F 3/195* (2013.01); *H03F 2200/387* (2013.01); *H03F 2200/391* (2013.01); *H03F 2200/421* (2013.01); *H03F 2200/451* (2013.01)

(58) Field of Classification Search
CPC .......... H03F 3/245; H03F 3/195; H03F 1/565; H03F 2200/451; H03F 2200/421; H03F 2200/387; H03F 2200/391; H03F 2200/372; H03F 2200/294; H03F 3/45475; H03F 3/04; H03F 3/10; H01L 29/00
USPC ................................ 330/117, 126, 301, 302
See application file for complete search history.

(56) References Cited

U.S. PATENT DOCUMENTS

| | | | | |
|---|---|---|---|---|
| 5,969,582 A | * | 10/1999 | Boesch ...................... | H03F 1/56 333/129 |
| 6,054,902 A | * | 4/2000 | Masato ...................... | H03F 3/72 330/306 |
| 6,501,331 B2 | * | 12/2002 | Adar ...................... | H03F 1/0261 330/126 |
| 7,656,228 B2 | * | 2/2010 | Fukuda ................. | H03F 1/0288 330/126 |

(Continued)

FOREIGN PATENT DOCUMENTS

WO    2012/105534 A1    8/2012

*Primary Examiner* — Khanh V Nguyen
(74) *Attorney, Agent, or Firm* — Pearne & Gordon LLP

(57) ABSTRACT

A power amplifier circuit includes a power amplifier, first and second filters, and first and second output paths. The power amplifier is able to amplify both of a first signal and a second signal. The frequency of the second signal is higher than that of the first signal. The first filter includes a first inductor and attenuates the second signal amplified in the power amplifier. The first inductor serves as a path for the first signal amplified in the power amplifier. The second filter includes a first capacitor and attenuates the first signal amplified in the power amplifier. The first capacitor serves as a path for the second signal amplified in the power amplifier. The first signal outputted from the first filter is supplied to the first output path. The second signal outputted from the second filter is supplied to the second output path.

20 Claims, 19 Drawing Sheets

(56) References Cited

U.S. PATENT DOCUMENTS

| | | | |
|---|---|---|---|
| 8,736,378 B1 * | 5/2014 | Hau | H03F 1/0277 |
| | | | 330/147 |
| 8,766,727 B2 * | 7/2014 | Aramata | H03F 1/565 |
| | | | 330/302 |
| 2005/0233764 A1 * | 10/2005 | Solski | H03H 7/383 |
| | | | 455/552.1 |
| 2013/0307629 A1 | 11/2013 | Aramata | |

* cited by examiner

POWER AMPLIFIER CIRCUIT

This application claims priority from Japanese Patent Application No. 2017-211126 filed on Oct. 31, 2017. The content of this application is incorporated herein by reference in its entirety.

BACKGROUND OF THE DISCLOSURE

1. Field of the Disclosure

The present disclosure relates to a power amplifier circuit including an output matching circuit.

2. Description of the Related Art

In a mobile communication terminal, such as a cellular phone, a power amplifier circuit (power amplifier) is used for amplifying power of a signal to be transmitted to a base station. Some mobile communication terminals include a multiband-support power amplifier circuit that is capable of transmitting multiple signals having different frequency bands.

In accordance with high-density mounting of a mobile communication terminal with upgraded capabilities, the same components, such as an antenna, a switch, a separator, and a power amplifier, are being used for all frequency band signals so as to reduce the number of components in a multiband-support mobile communication terminal. For example, International Publication No. 2012/105534 discloses a power amplifier circuit for amplifying a signal of a first frequency and a signal of a second frequency. This power amplifier circuit includes a power amplifier for amplifying a transmit signal of the first frequency and a transmit signal of the second frequency. At the output side of the power amplifier, a first LC parallel resonance circuit including a switch and using the first frequency as the resonant frequency and a second LC parallel resonance circuit including a switch and using the second frequency as the resonant frequency are connected in parallel with each other. When the power amplifier amplifies a signal of the first frequency, the switch of the first LC parallel resonance circuit is ON, while the switch of the second LC parallel resonance circuit is OFF. When the power amplifier amplifies a signal of the second frequency, the switch of the first LC parallel resonance circuit is OFF, while the switch of the second LC parallel resonance circuit is ON.

BRIEF SUMMARY OF THE DISCLOSURE

In the power amplifier circuit disclosed in this publication, in each of the first and second LC parallel resonance circuits, the switch is connected in series with an inductor, and a capacitor is used as the main path for a signal of the first or second frequency. If the first frequency is lower than the second frequency, a capacitor of a small capacitance is required in the first LC parallel resonance circuit in order to attenuate a signal of the second frequency. However, a capacitor of a small capacitance increases the loss of a signal of the first frequency passing through the capacitor of the first LC parallel resonance circuit.

The present disclosure has been made in view of this background. It is an object of the present disclosure to provide a power amplifier circuit that is less likely to decrease the power gain.

According to an aspect of the disclosure, there is provided a power amplifier circuit including a power amplifier, first and second filters, and first and second output paths. The power amplifier is able to amplify both of a first signal and a second signal. The frequency of the second signal is higher than that of the first signal. The first filter includes a first inductor and attenuates the second signal amplified in the power amplifier. The first inductor serves as a path for the first signal amplified in the power amplifier. The second filter includes a first capacitor and attenuates the first signal amplified in the power amplifier. The first capacitor serves as a path for the second signal amplified in the power amplifier. The first signal outputted from the first filter is supplied to the first output path. The second signal outputted from the second filter is supplied to the second output path.

According to an aspect of the disclosure, it is possible to provide a power amplifier circuit that is less likely to decrease the power gain.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
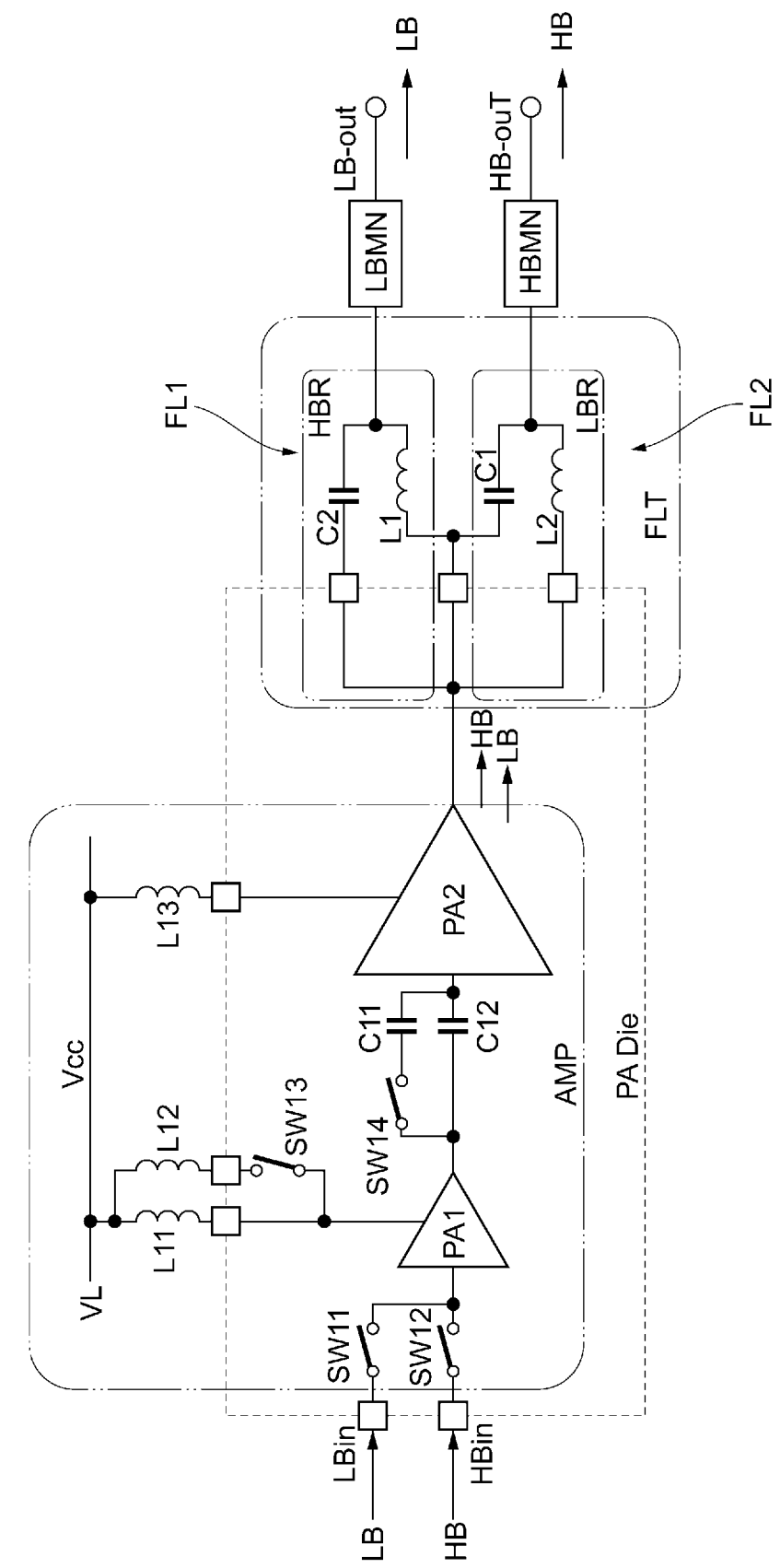
FIG. 1 is a schematic diagram illustrating the circuit configuration of a power amplifier circuit according to a first embodiment.

Embodiments of the disclosure will be described below with reference to the accompanying drawings. In second through sixteenth embodiments, elements identical to or similar to those of a first embodiment will be designated by like reference numerals, and a detailed explanation thereof will be omitted. An explanation of advantages obtained by the second through sixteenth embodiments similar to those of the first embodiment will be omitted. The drawings are only examples, and the dimensions and the configurations of the individual elements are illustrated merely schematically. The embodiments are not intended to be exhaustive or to limit the technical scope of the disclosure.

First Embodiment

Figure 2:
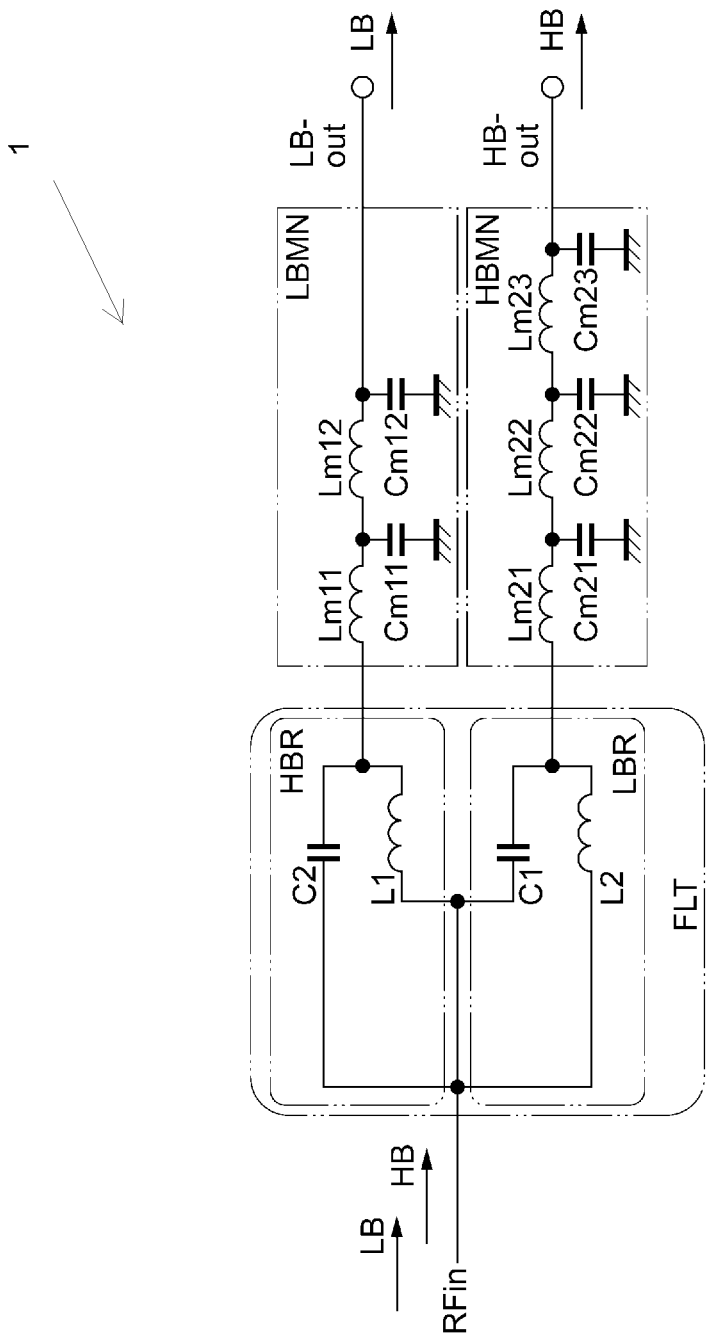
FIG. 2 is a schematic diagram illustrating an example of a matching circuit for first and second signals.

The configuration of a power amplifier circuit 1 according to a first embodiment of the disclosure will be described below with reference to FIGS. 1 and 2. FIG. 1 is a schematic diagram illustrating the circuit configuration of the power amplifier circuit 1 according to the first embodiment. FIG. 2 is a schematic diagram illustrating an example of a matching circuit for first and second signals.

The power amplifier circuit 1 is a radio-frequency (RF) circuit used in a mobile communication terminal, such as a cellular phone, to amplify power of a first signal LB and a second signal HB having different frequencies to a level high enough to be transmitted to a base station. The first signal LB and the second signal HB are RF signals that are modulated by a radio frequency integrated circuit (RFIC), for example, according to a predetermined communication method. The frequency band of the second signal HB is higher than that of the first signal LB. The power amplifier circuit 1 may be mounted on a terminal other than a mobile communication terminal, for example, a fixed communication terminal, provided that it amplifies the first signal LB and the second signal HB.

The power amplifier circuit 1 includes a first input terminal LBin and a second input terminal HBin, a first output terminal LBout, and a second output terminal HBout. In the power amplifier circuit 1, the first signal LB is inputted from the first input terminal LBin and is outputted from the first output terminal LBout, while the second signal HB is inputted from the second input terminal HBin and is outputted from the second output terminal HBout.

The power amplifier circuit 1 includes a power amplifier unit AMP and a filter unit FLT. The first signal LB and the second signal HB are amplified in the power amplifier unit AMP and are outputted via the filter unit FLT. The power amplifier circuit 1 includes a first matching circuit LBMN between the filter unit FLT and the first output terminal LBout and a second matching circuit HBMN between the filter unit FLT and the second output terminal HBout.

The power amplifier unit AMP is constituted by two stages of amplifier circuits, for example, a first power amplifier PA1 and a second power amplifier PA2 (power amplifier). The power amplifier unit AMP amplifies one of the first signal LB and the second signal HB. The first and second power amplifiers PA1 and PA2 are formed on a single semiconductor chip (PA Die), for example. The first and second power amplifiers PA1 and PA2 each include a bipolar transistor, such as a heterojunction bipolar transistor, and amplify an input signal and output an amplified signal. The first and second power amplifiers PA1 and PA2, which are common-emitter amplifier circuits, for example, each amplify a signal inputted into the base in accordance with the power supply voltage Vcc supplied to the collector. The power amplifier unit AMP is not restricted to a two-stage power amplifier unit, and may be constituted by one stage or three or more stages of power amplifiers.

The first power amplifier PA1 corresponds to a driver-stage amplifier circuit. The first power amplifier PA1 receives the power supply voltage Vcc (battery voltage or regulator voltage, for example) of a predetermined level and amplifies the first signal LB or the second signal HB.

A switch SW11 is disposed between the first input terminal LBin and the first power amplifier PA1, while a switch SW12 is disposed between the second input terminal HBin and the first power amplifier PA1. The switch SW11 turns ON and OFF the inputting of the first signal LB into the first power amplifier PA1. The switch SW12 turns ON and OFF the inputting of the second signal HB into the first power amplifier PA1. An inductor L11 is connected between the first power amplifier PA1 and a power supply line VL for supplying the power supply voltage Vcc. An inductor L12 and a switch SW13 are connected in series with each other and in parallel with the inductor L11. The switch SW13 turns ON and OFF the supplying of the power supply voltage Vcc to the first power amplifier PA1 via the inductor L12. That is, when the switch SW13 is open, the power supply voltage Vcc is supplied to the first power amplifier PA1 via the inductor L11. When the switch SW13 is closed, the power supply voltage Vcc is supplied to the first power amplifier PA1 via the inductors L11 and L12.

A capacitor C12 is connected between the first and second power amplifiers PA1 and PA2. A capacitor C11 and a switch SW14 are connected in series with each other and in parallel with the capacitor C12. The switch SW14 turns ON and OFF the transmitting of an RF signal from the first power amplifier PA1 to the second power amplifier PA2 via the capacitor C11. That is, when the switch SW14 is open, an RF signal outputted from the first power amplifier PA1 is inputted into the second power amplifier PA2 via the capacitor C12. When the switch SW14 is closed, an RF signal outputted from the first power amplifier PA1 is inputted into the second power amplifier PA2 via the capacitors C11 and C12. The capacitors C11 and C12 form an inter-stage matching circuit for adjusting impedance matching between the first and second power amplifiers PA1 and PA2. The inter-stage matching circuit may include another element, such as an inductor or a resistor element.

The second power amplifier PA2 corresponds to an output-stage amplifier circuit. The second power amplifier PA2 receives the power supply voltage Vcc (battery voltage or regulator voltage, for example) and amplifies the first signal LB or the second signal HB amplified by the first power amplifier PA1. An inductor L13 is connected between the second power amplifier PA2 and the power supply line VL for supplying the power supply voltage Vcc.

The first and second power amplifiers PA1 and PA2 may be controlled by envelope tracking. In envelope tracking, the power supply voltage Vcc to be supplied to the first and second power amplifiers PA1 and PA2 is adjusted in accordance with the amplitude level of the first signal LB or the second signal HB to be inputted into the first power amplifier PA1 and the second power amplifier PA2. The first and second power amplifiers PA1 and PA2 may alternatively be controlled by average power tracking.

The filter unit FLT includes first and second filters FL1 and FL2. The first filter FL1 is disposed between the output terminal of the second power amplifier PA2 and the first output terminal LBout. The second filter FL2 is disposed between the output terminal of the second power amplifier PA2 and the second output terminal HBout.

The first filter FL1 includes an LC parallel resonance circuit constituted by an inductor L1 (first inductor) and a capacitor C2 (second capacitor) connected in parallel with each other. The inductor L1 serves as a path for the first signal LB. The LC parallel resonance circuit of the first filter FL1 serves as a band elimination filter HBR which attenuates RF signals of a relatively high-frequency band inputted into the power amplifier circuit 1. That is, the band elimination filter HBR attenuates the second signal HB.

The second filter FL2 includes an LC parallel resonance circuit constituted by a capacitor C1 (first capacitor) and an inductor L2 (second inductor) connected in parallel with each other. The capacitor C1 serves as a path for the second signal HB. The LC parallel resonance circuit of the second filter FL2 serves as a band elimination filter LBR which attenuates RF signals of a relatively low-frequency band inputted into the power amplifier circuit 1. That is, the band elimination filter LBR attenuates the first signal LB.

The first signal LB outputted from the second power amplifier PA2 is outputted via the first filter FL1, while the second signal HB outputted from the second power amplifier PA2 is outputted via the second filter FL2. More specifically, in the power amplifier circuit 1, the first signal LB and the second signal HB are respectively outputted from the first and second filters FL1 and FL2 in the following manner. The first signal LB passes through the first filter FL1 via the inductor L1, which serves as the transmit path, while being reflected and attenuated in the second filter FL2. The second signal HB passes through the second filter FL2 via the capacitor C1, which serves as the transmit path, while being reflected and attenuated in the first filter FL1.

The first signal LB having a lower frequency than the second signal HB passes through the first filter FL1 via the inductor L1 as the transmit path. The loss of the first signal LB can thus be reduced. The second signal HB having a higher frequency than the first signal LB passes through the second filter FL2 via the capacitor C1 as the transmit path. The loss of the second signal HB can thus be reduced. The power amplifier circuit 1 is capable of amplifying two signals (first signal LB and second signal HB) by using only one power amplifier unit AMP, so that the area of the power amplifier circuit 1 can be reduced. In the power amplifier circuit 1, no switches are disposed in the transmit path for the first signal LB from the second power amplifier PA2 to the first output terminal LBout, while no switches are disposed in the transmit path for the second signal HB from the second power amplifier PA2 to the second output terminal HBout. This configuration can decrease the area of the power amplifier circuit 1 and also reduce the loss of the first signal LB and the second signal HB.

The inductance of the inductor L2 may be greater than that of the inductor L1. This can decrease the frequency bandwidth of signals to be attenuated in the band elimination filter LBR of the second filter FL2. The capacitance of the capacitor C2 may be smaller than that of the capacitor C1. This can decrease the frequency bandwidth of signals to be attenuated in the band elimination filter HBR of the first filter FL1. The power amplifier circuit 1 can thus reduce the loss of the first signal LB in the first filter FL1 and the loss of the second signal HB in the second filter FL2.

The first matching circuit LBMN is formed in a first output path which receives the first signal LB outputted from the first filter FL1. The first matching circuit LBMN adjusts impedance matching of the first signal LB in the first output path. The first matching circuit LBMN may attenuate the second signal HB. In this manner, the first matching circuit LBMN can attenuate the second signal HB which has not been sufficiently attenuated in the first filter FL1 and leaked to the first output path, thereby reducing a leakage of the second signal HB from the first output terminal LBout. If the frequency band of harmonics of the first signal LB is a band that can pass through the first filter FL1, the first matching circuit LBMN may also attenuate the harmonics of the first signal LB.

The second matching circuit HBMN is formed in a second output path which receives the second signal HB outputted from the second filter FL2. The second matching circuit HBMN adjusts impedance matching of the second signal HB in the second output path. The second matching circuit HBMN may attenuate harmonics of the first signal LB. Then, even if the frequency band of harmonics of the first signal LB is a band that can pass through the second filter FL2, the second matching circuit HBMN attenuates the harmonics of the first signal LB, thereby reducing a leakage of the harmonics of the first signal LB from the second output terminal HBout. The second matching circuit HBMN may have the function of attenuating the first signal LB.

As shown in FIG. 2, the first matching circuit LBMN includes inductors Lm11 and Lm12 and capacitors Cm11 and Cm12, for example. The inductors Lm11 and Lm12 are connected in series with the first output path. The capacitor Cm11 is connected between a ground and a node between the inductors Lm11 and Lm12 in the first output path. The capacitor Cm12 is connected between a ground and a node between the inductor Lm12 and the first output terminal LBout in the first output path. Likewise, the second matching circuit HBMN includes inductors Lm21, Lm22, and Lm23 connected in series with the second output path and capacitors Cm21, Cm22, and Cm23 connected between the second output path and a ground. The first matching circuit LBMN and the second matching circuit HBMN are not restricted to the above-described configurations.

Second Embodiment

Figure 3:
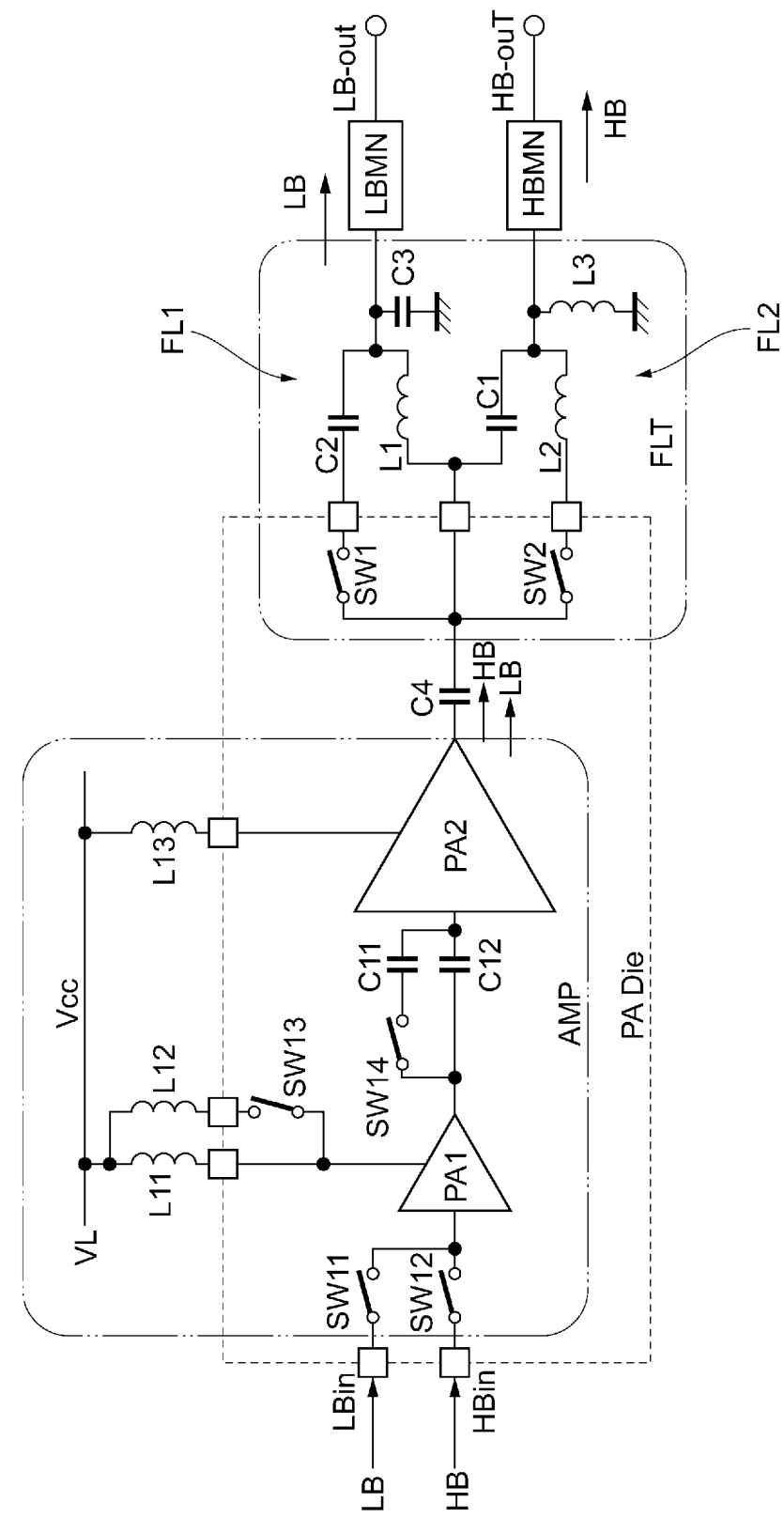
FIG. 3 is a schematic diagram illustrating the circuit configuration of a power amplifier circuit according to a second embodiment.

The configuration of a power amplifier circuit 2 according to a second embodiment of the disclosure will be described below with reference to FIG. 3. FIG. 3 is a schematic diagram illustrating the circuit configuration of the power amplifier circuit 2 according to the second embodiment.

The power amplifier circuit 2 is different from the power amplifier circuit 1 of the first embodiment in that it includes a switch SW1 (first switch), a capacitor C3 (third capacitor), a switch SW2 (second switch), an inductor L3 (third inductor), and a capacitor C4 (fourth capacitor).

The switch SW1 and the capacitor C3 are disposed in the first filter FL1. The switch SW1 is connected in series with the capacitor C2 and in parallel with the inductor L1. The capacitor C3 is connected between the first output path and a ground. The capacitor C3 branches off from the first output path between the first inductor L1 and the first matching circuit LBMN. When the switch SW1 is ON, the power amplifier circuit 2 operates as a power amplifier circuit for the second signal HB. When the switch SW1 is OFF, the power amplifier circuit 2 operates as a power amplifier circuit for the first signal LB. Hereinafter, the operation for amplifying power of the second signal HB will be called the HB operation, while the operation for amplifying power of the first signal LB will be called the LB operation.

During the LB operation, the switch SW1 is OFF, and the first signal LB passes through the inductor L1 and is outputted from the first output terminal LBout. During the HB operation, the switch SW1 is ON, and the capacitor C2 and the inductor L1 form an LC parallel resonance circuit so as to increase the impedance at and around the resonant frequency. Even if the resistance components of the switch SW1 are high when the switch SW1 is ON, the impedance is also high because of the formation of the LC parallel resonance circuit of the first filter FL1, thereby making the influence of the resistance components of the switch SW1 negligible. Accordingly, the switch SW1 can be formed in a small size. During the LB operation, the first filter FL1 operates as a matching circuit serving as a low pass filter including the inductor L1 and the capacitor C3 and does not use the switch SW1 as the path for the first signal LB. The first filter FL1 serves as a matching circuit without using the switch SW1 for the first signal LB, and loss which would be caused by the resistance components of the switch SW1 does not occur in the first signal LB. As a result, the power gain is less likely to decrease in the power amplifier circuit 2.

In the configuration in FIG. 3, the switch SW1 is disposed between the second power amplifier PA2 and the capacitor C2. However, the order in which the switch SW1 and the capacitor C2 are arranged may be reversed, provided that the switch SW1 can turn ON and OFF the function of the LC parallel resonance circuit of the first filter FL1. That is, the capacitor C2 may be connected between the second power amplifier PA2 and the switch SW1.

The switch SW2 and the inductor L3 are disposed in the second filter FL2. The switch SW2 is connected in series with the inductor L2 and in parallel with the capacitor C1. The inductor L3 is connected between the second output path and a ground. The inductor L3 branches off from the second output path between the first capacitor C1 and the second matching circuit HBMN. When the switch SW2 is ON, the power amplifier circuit 2 performs the LB operation. When the switch SW2 is OFF, the power amplifier circuit 2 performs the HB operation.

During the HB operation, the switch SW2 is OFF, and the second signal HB passes through the capacitor C1 and is outputted from the second output terminal HBout. During the LB operation, the switch SW2 is ON, and the capacitor C1 and the inductor L2 form an LC parallel resonance circuit so as to increase the impedance at and around the resonant frequency. Even if the resistance components of the switch SW2 are high when the switch SW2 is ON, the impedance is also high because of the formation of the LC parallel resonance circuit of the second filter FL2, thereby making the influence of the resistance components of the switch SW2 negligible. Accordingly, the switch SW2 can be formed in a small size. During the HB operation, the second filter FL2 operates as a matching circuit serving as a high pass filter including the capacitor C1 and the inductor L3 and does not use the switch SW2 as the path for the second signal HB. The second filter FL2 serves as a matching circuit without using the switch SW2 for the second signal HB, and loss which would be caused by the resistance components of the switch SW2 does not occur in the second signal HB. As a result, the power gain is less likely to decrease in the power amplifier circuit 2.

In the configuration in FIG. 3, the switch SW2 is disposed between the second power amplifier PA2 and the inductor L2. However, the order in which the switch SW2 and the inductor L2 are arranged may be reversed, provided that the switch SW2 can turn ON and OFF the function of the LC parallel resonance circuit of the second filter FL2. That is, the inductor L2 may be connected between the second power amplifier PA2 and the switch SW2.

The capacitor C4 is connected between the power amplifier unit AMP and the filter unit FLT. The switch SW1 is connected between the capacitors C4 and the C2, while the switch SW2 is connected between the capacitor C4 and the inductor L2. The capacitor C4 can stop a DC voltage outputted from the second power amplifier PA2 so as to restrict RF signals to be applied to the switches SW1 and SW2 to those without DC components. The switches SW1 and SW2 can thus allow high-amplitude RF signals to pass therethrough.

In the configuration in FIG. 3, the switch SW1 is disposed between the capacitors C4 and C2, while the switch SW2 is disposed between the capacitor C4 and the inductor L2. This can decrease the size of the switches SW1 and SW2, thereby making it possible to reduce the loss of the first signal LB in the switch SW1 and that of the second signal HB in the switch SW2. The capacitor C4 may not necessarily be connected between the second power amplifier PA2 and the first filter FL1 if it is connected between the second power amplifier PA2 and the second filter FL2. This can decrease the size of at least the switch SW2 and reduce the loss of the second signal HB in the switch SW2. If the capacitor C4 is not connected between the second power amplifier PA2 and the switch SW1, the capacitor C2 may be connected between the switch SW1 and the second power amplifier PA2. In this case, the capacitor C2 blocks a DC voltage from being applied to the switch SW1, and the capacitor C4 blocks a DC voltage from being applied to the switch SW2. This can decrease the size of the switches SW1 and SW2 and reduce the loss of the first signal LB in the switch SW1 and the loss of the second signal HB in the switch SW2.

Figure 4:
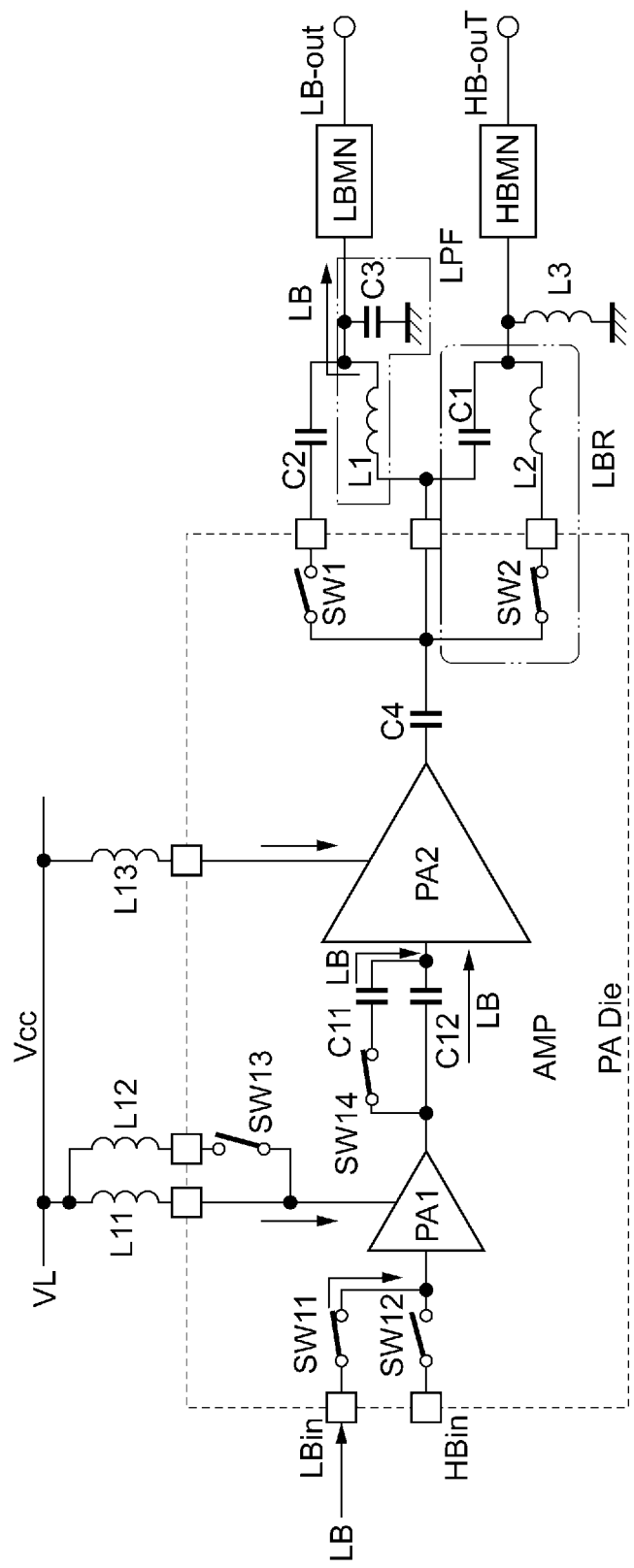
FIG. 4 is a circuit diagram schematically illustrating the operation for amplifying a first signal in the power amplifier circuit of the second embodiment.
Figure 5:
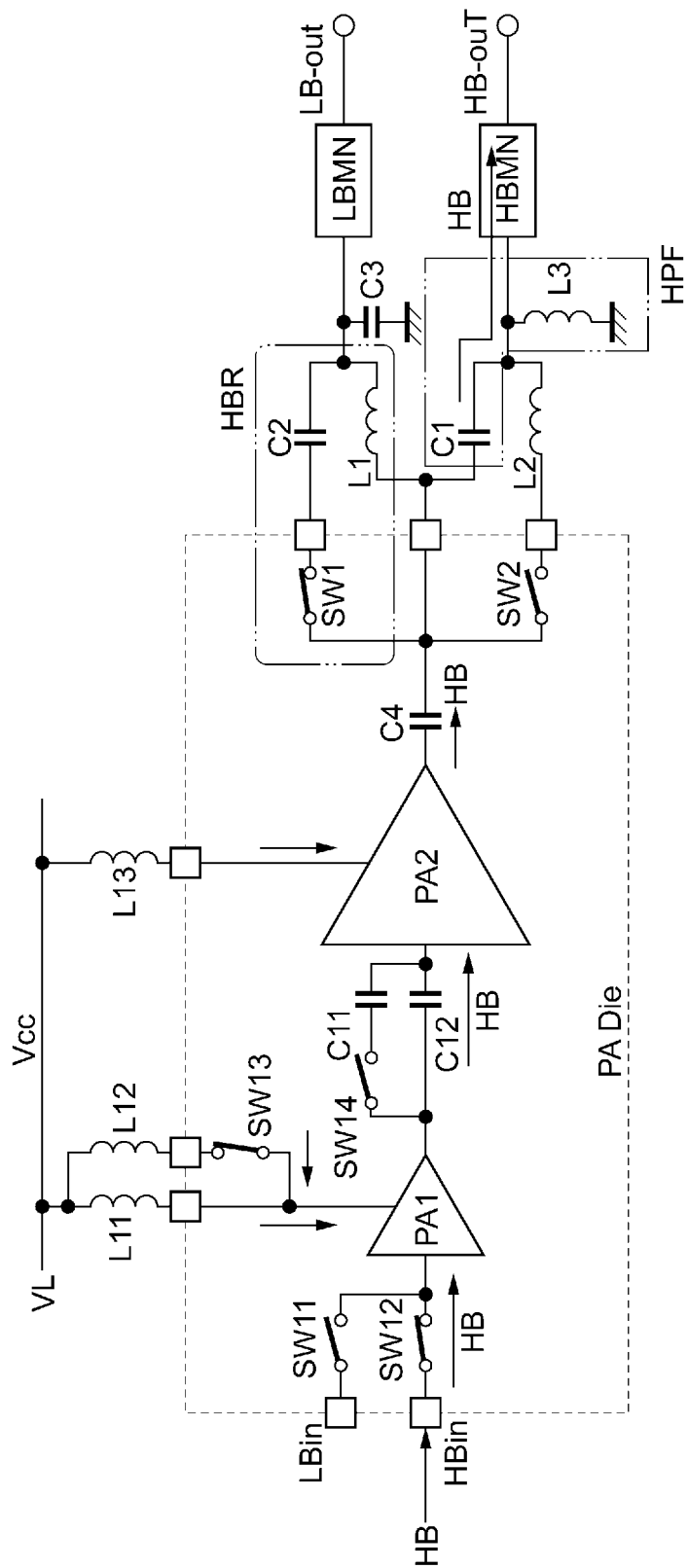
FIG. 5 is a circuit diagram schematically illustrating the operation for amplifying a second signal in the power amplifier circuit of the second embodiment.

The operation of the power amplifier circuit 2 according to the second embodiment will be discussed below with reference to FIGS. 4 and 5. FIG. 4 is a circuit diagram schematically illustrating the operation for amplifying the first signal LB in the power amplifier circuit 2. FIG. 5 is a circuit diagram schematically illustrating the operation for amplifying the second signal HB in the power amplifier circuit 2.

As shown in FIG. 4, when the first signal LB is amplified, the switches SW11, SW14, and SW2 are closed, and the switches SW12, SW13, and SW1 are open. The first signal LB is inputted from the first input terminal LBin into the first power amplifier PA1 via the switch SW11. The power supply voltage Vcc is supplied from the power supply line VL to the first power amplifier PA1 via the inductor L11. The first signal LB is amplified in the first power amplifier PA1 and is inputted into the second power amplifier PA2 via the capacitors C11 and C12. The power supply voltage Vcc is supplied from the power supply line VL to the second power amplifier PA2 via the inductor L13.

The first signal LB is amplified in the second power amplifier PA2, passes through the inductor L1 and the first matching circuit LBMN, and is outputted from the first output terminal LBout. The DC components (DC voltage) included in the first signal LB are blocked by the capacitor C4 after being outputted from the second power amplifier PA2. The LC parallel resonance circuit constituted by the capacitor C1 and the inductor L2 of the second filter FL2 can increase the impedance for the first signal LB. Hence, the first signal LB is not outputted to the second output terminal HBout.

As shown in FIG. 5, when the second signal HB is amplified, the switches SW12, SW13, and SW1 are closed, and the switches SW11, SW14, and SW2 are open. The second signal HB is inputted from the second input terminal HBin into the first power amplifier PA1 via the switch SW12. The power supply voltage Vcc is supplied from the power supply line VL to the first power amplifier PA1 via the inductors L11 and L12. The second signal HB is amplified in the first power amplifier PA1 and is inputted into the second power amplifier PA2 via the capacitor C12. The power supply voltage Vcc is supplied from the power supply line VL to the second power amplifier PA2 via the inductor L13.

The second signal HB is amplified in the second power amplifier PA2, passes through the capacitor C1 and the second matching circuit HBMN, and is outputted from the second output terminal HBout. The DC components (DC voltage) included in the second signal HB are blocked by the capacitor C4 after being outputted from the second power amplifier PA2. Harmonics outputted from the second power amplifier PA2 are attenuated by the band elimination filter HBR constituted by the capacitor C2 and the inductor L1. The LC parallel resonance circuit constituted by the capacitor C2 and the inductor L1 of the first filter FL1 can increase the impedance for the second signal HB. Hence, the second signal HB is not outputted to the first output terminal LBout.

Third Embodiment

Figure 6:
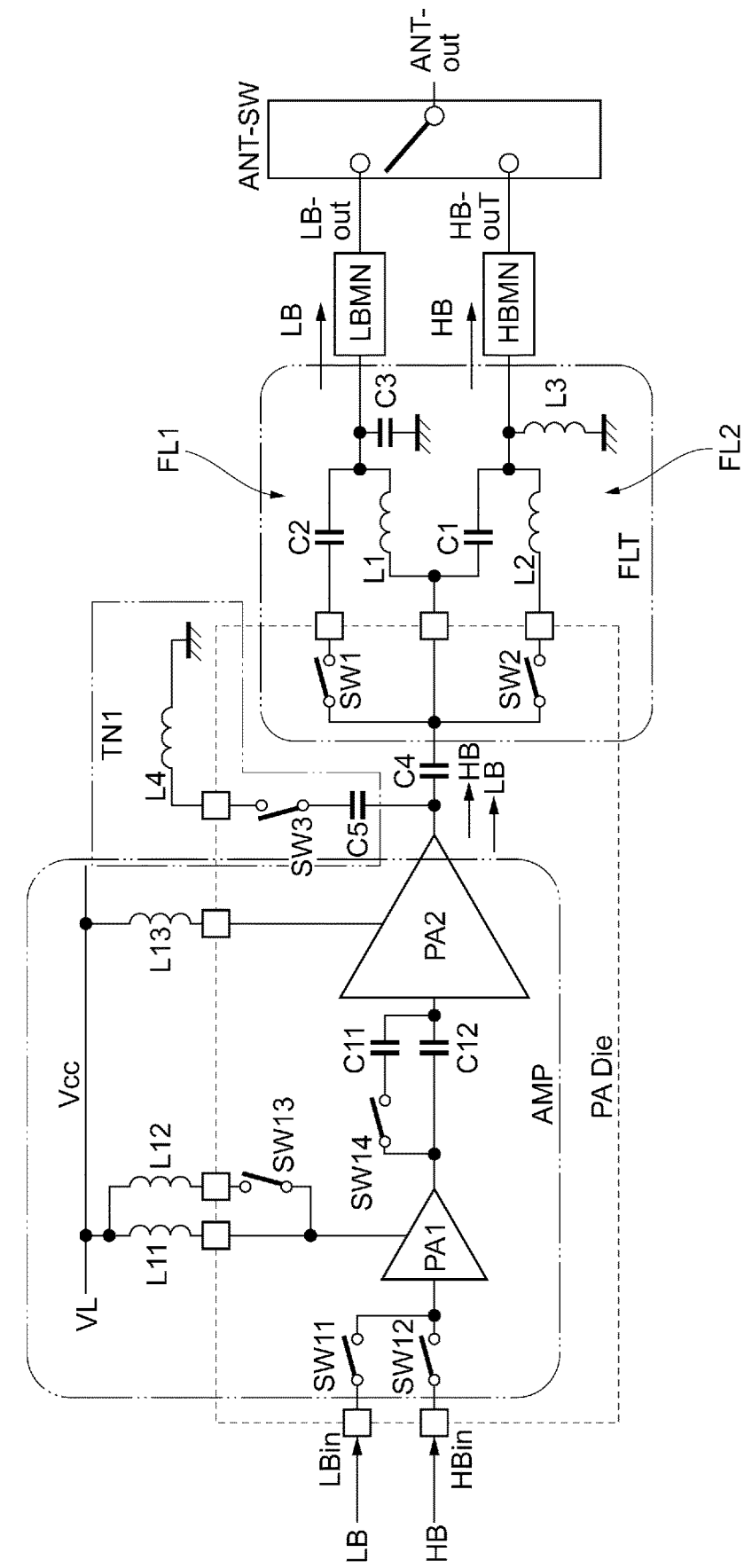
FIG. 6 is a schematic diagram illustrating the circuit configuration of a power amplifier circuit according to a third embodiment.

The configuration of a power amplifier circuit 3 according to a third embodiment of the disclosure will be described below with reference to FIG. 6. FIG. 6 is a schematic diagram illustrating the circuit configuration of the power amplifier circuit 3 according to the third embodiment.

The power amplifier circuit 3 is different from the power amplifier circuit 2 of the second embodiment in that it includes an antenna switch ANT-SW (output switch) and a first harmonics terminator TN1.

The antenna switch ANT-SW outputs one of the first signal LB supplied to the first output path and the second signal HB supplied to the second output path. The antenna switch ANT-SW switches the electrical connection of an antenna terminal ANTout to one of the first output terminal LBout and the second output terminal HBout. The antenna terminal ANTout is electrically connected to an external antenna. That is, it is possible to output both of the first signal LB and the second signal HB via the antenna terminal ANTout. When outputting the first signal LB, the antenna switch ANT-SW electrically disconnects the second output terminal HBout from the antenna terminal ANTout. When outputting the second signal HB, the antenna switch ANT-SW electrically disconnects the first output terminal LBout from the antenna terminal ANTout. With this configuration, when amplifying the first signal LB, the power amplifier circuit 3 can reduce harmonics and fundamental waves of the first signal LB which may leak via the second output terminal HBout.

The first harmonics terminator TN1 attenuates harmonics of the first signal LB or those of the second signal HB produced in the power amplifier unit AMP. When amplifying the first signal LB, the power amplifier circuit 3 can reduce harmonics of the first signal LB which may leak from the second output terminal HBout. The first harmonics terminator TN1 is connected between a ground and a path between the second power amplifier PA2 and the capacitor C4.

The first harmonics terminator TN1 includes a capacitor C5 (fifth capacitor), a switch SW3 (third switch), and an inductor L4 (fourth inductor). The switch SW3 is connected between the capacitor C5 and a ground. The switch SW3 turns ON and OFF the operation of the first harmonics terminator TN1. When the switch SW3 is closed, an LC series resonance circuit constituted by the capacitor C5 and the inductor L4 is formed and is grounded. The first harmonics terminator TN1 thus serves as a path for causing harmonic signals matching the resonant frequency of the LC series resonance circuit to be grounded. When the switch SW3 is open, the capacitor C5 and the inductor L4 are not connected to each other and do not form an LC series resonance circuit. The first harmonics terminator TN1 does not serve as a path for causing the above-described harmonic signals to be grounded. With this configuration, the capacitor C5 can stop a DC voltage, and the switch SW3 accordingly allows high-amplitude RF signals to pass therethrough. The inductor L4 is connected between the switch SW3 and a ground. However, the inductor L4 may be located at any position, provided that it is connected in series with the capacitor C5. For example, the inductor L4 may be connected between the capacitor C5 and the switch SW3.

The first harmonics terminator TN1 may not necessarily be connected between a ground and a path between the second power amplifier PA2 and the capacitor C4, provided that it is connected between a ground and a path between the second power amplifier PA2 and the second filter FL2.

Fourth Embodiment

Figure 7:
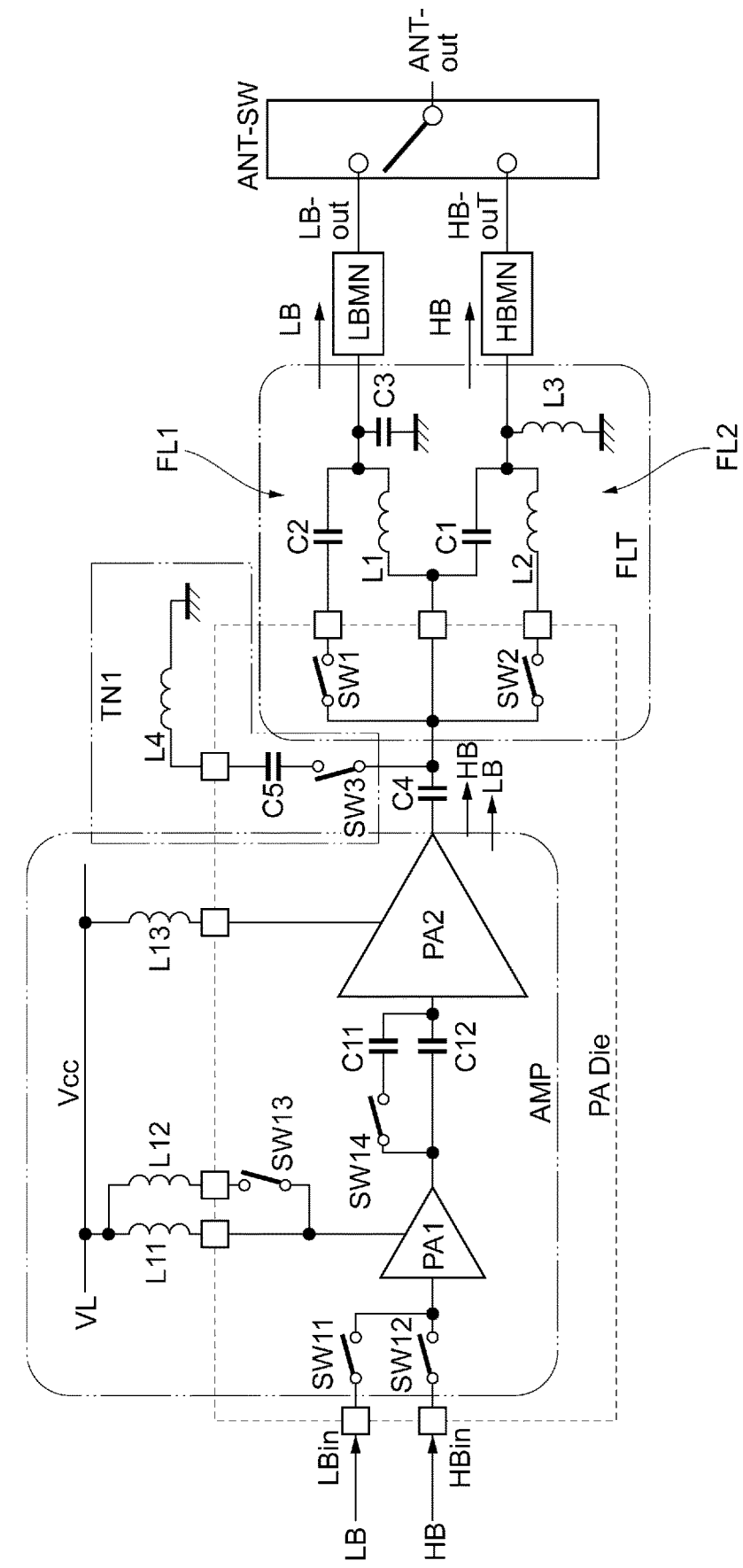
FIG. 7 is a schematic diagram illustrating the circuit configuration of a power amplifier circuit according to a fourth embodiment.

The configuration of a power amplifier circuit 4 according to a fourth embodiment of the disclosure will be described below with reference to FIG. 7. FIG. 7 is a schematic diagram illustrating the circuit configuration of the power amplifier circuit 4 according to the fourth embodiment.

The power amplifier circuit 4 is different from the power amplifier circuit 3 of the third embodiment in that the switch SW3 of the first harmonics terminator TN1 is connected between a ground and a path between the capacitor C4 and the second filter FL2.

In the third embodiment, the switch SW3 is connected to the second power amplifier PA2 via the capacitor C5. In the fourth embodiment, the switch SW3 is connected to the second power amplifier PA2 via the capacitor C4. The capacitor C4 can block a DC voltage outputted from the second power amplifier PA2, so that the voltage of an RF signal to be applied to the switch SW3 does not contain a DC voltage. Accordingly, it is not necessary that the capacitor C5 remove the DC voltage for the switch SW3, unlike the third embodiment, thereby increasing the flexibility in disposing the elements in the first harmonics terminator TN1.

Fifth Embodiment

Figure 8:
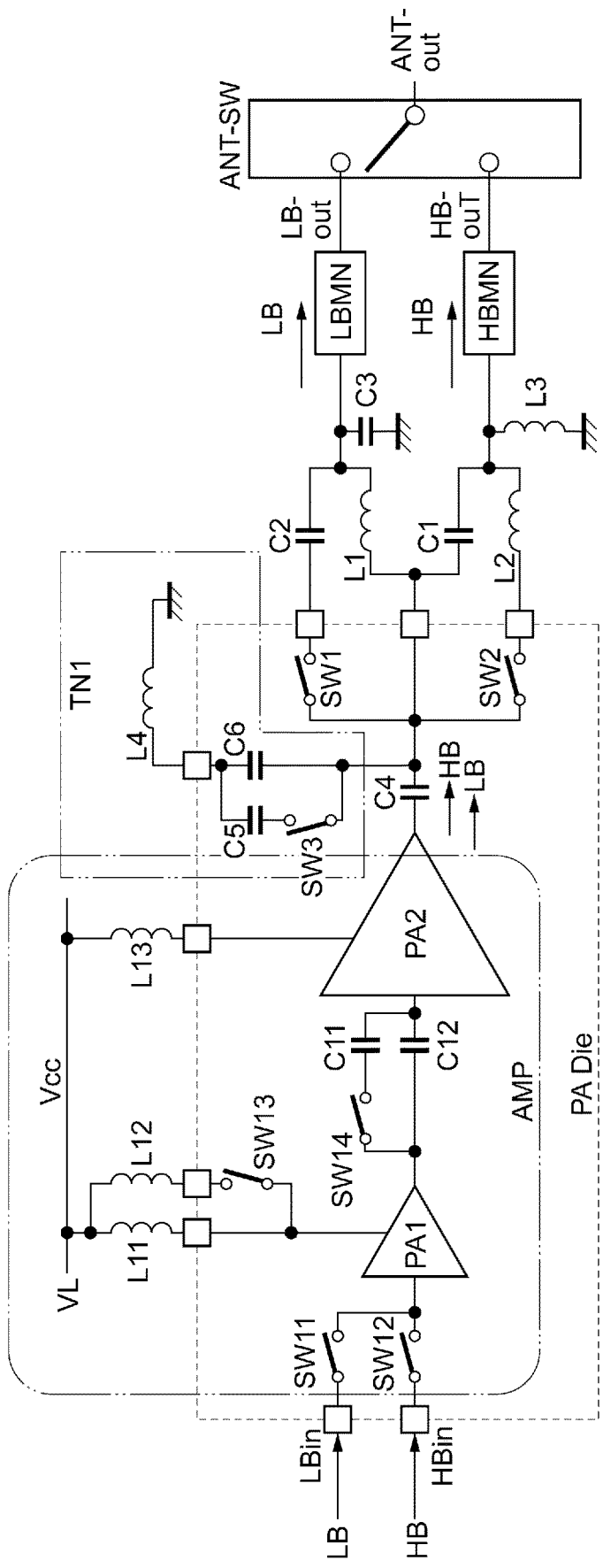
FIG. 8 is a schematic diagram illustrating the circuit configuration of a power amplifier circuit according to a fifth embodiment.

The configuration of a power amplifier circuit 5 according to a fifth embodiment of the disclosure will be described below with reference to FIG. 8. FIG. 8 is a schematic diagram illustrating the circuit configuration of the power amplifier circuit 5 according to the fifth embodiment.

The power amplifier circuit 5 is different from the power amplifier circuit 4 of the fourth embodiment in that the first harmonics terminator TN1 also includes a capacitor C6 (sixth capacitor).

The capacitor C6 is connected in parallel with the capacitor C5 and the switch SW3 and in series with the inductor L4. That is, the first harmonics terminator TN1 can switch the capacitance by using the switch SW3 so as to change the resonant frequency. This enhances the attenuation efficiency for harmonics of the first signal LB and those of the second signal HB in the first harmonics terminator TN1.

Sixth Embodiment

Figure 9:
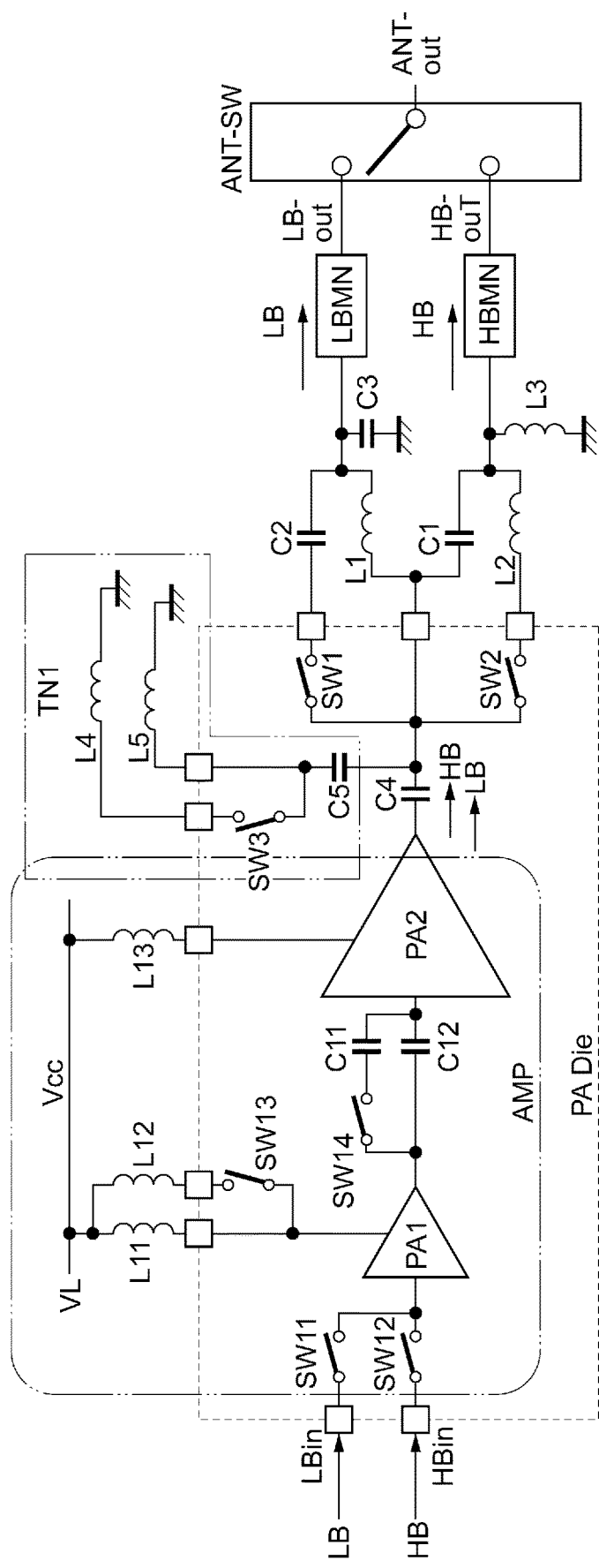
FIG. 9 is a schematic diagram illustrating the circuit configuration of a power amplifier circuit according to a sixth embodiment.

The configuration of a power amplifier circuit 6 according to a sixth embodiment of the disclosure will be described below with reference to FIG. 9. FIG. 9 is a schematic diagram illustrating the circuit configuration of the power amplifier circuit 6 according to the sixth embodiment.

The power amplifier circuit 6 is different from the power amplifier circuit 4 of the fourth embodiment in that the first harmonics terminator TN1 also includes an inductor L5 (fifth inductor).

The inductor L5 is connected in parallel with the inductor L4 and the switch SW3 and in series with the capacitor C5. That is, the first harmonics terminator TN1 can switch the inductance by using the switch SW3 so as to change the resonant frequency. This can improve the attenuation efficiency for harmonics of the first signal LB and those of the second signal HB in the first harmonics terminator TN1.

Seventh Embodiment

Figure 10:
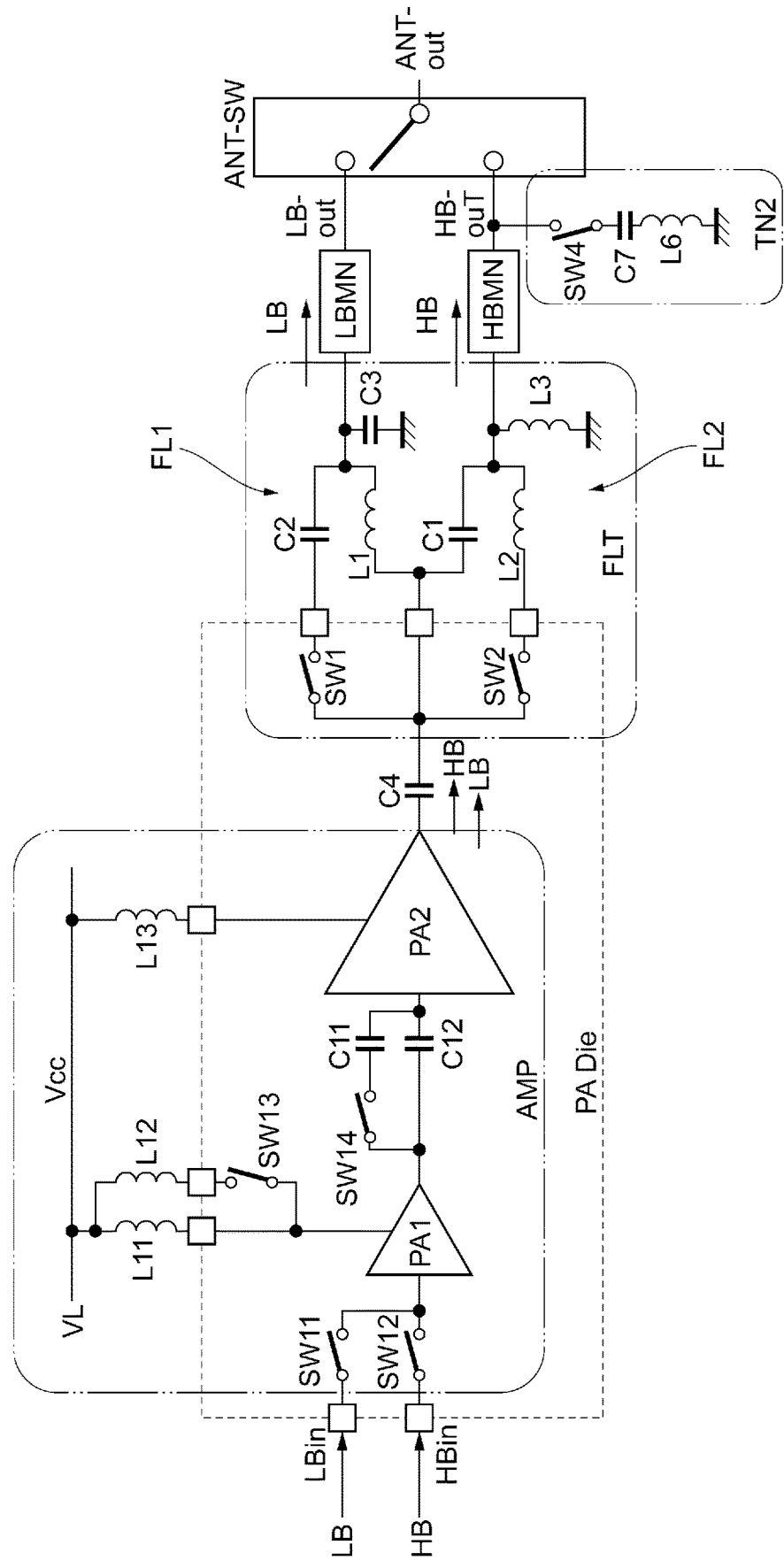
FIG. 10 is a schematic diagram illustrating the circuit configuration of a power amplifier circuit according to a seventh embodiment.

The configuration of a power amplifier circuit 7 according to a seventh embodiment of the disclosure will be described below with reference to FIG. 10. FIG. 10 is a schematic diagram illustrating the circuit configuration of the power amplifier circuit 7 according to the seventh embodiment.

The power amplifier circuit 7 is different from the power amplifier circuit 2 of the second embodiment in that it includes an antenna switch ANT-SW and a second harmonics terminator TN2. The antenna switch ANT-SW is similar to that of the power amplifier circuit 3 of the third embodiment, and a detailed explanation thereof will thus be omitted.

The second harmonics terminator TN2 attenuates harmonics of the first signal LB or those of the second signal HB produced in the power amplifier unit AMP. When amplifying the first signal LB, the power amplifier circuit 7 can reduce harmonics of the first signal LB which may leak from the second output terminal HBout. The second harmonics terminator TN2 is connected between a ground and the second output path for the second signal HB.

The second harmonics terminator TN2 includes a switch SW4 (fourth switch), a capacitor C7 (seventh capacitor), and an inductor L6 (sixth inductor). The capacitor C7 is connected between the switch SW4 and the inductor L6. The inductor L6 is connected between the capacitor C7 and a ground. The capacitor C4 can block a DC voltage, and the switch SW4 can thus allow high-amplitude RF signals to pass therethrough. The capacitor C7 may not necessarily be used for blocking a DC voltage to be applied to the switch SW4, thereby increasing the flexibility in disposing the elements in the second harmonics terminator TN2.

Eighth Embodiment

Figure 11:
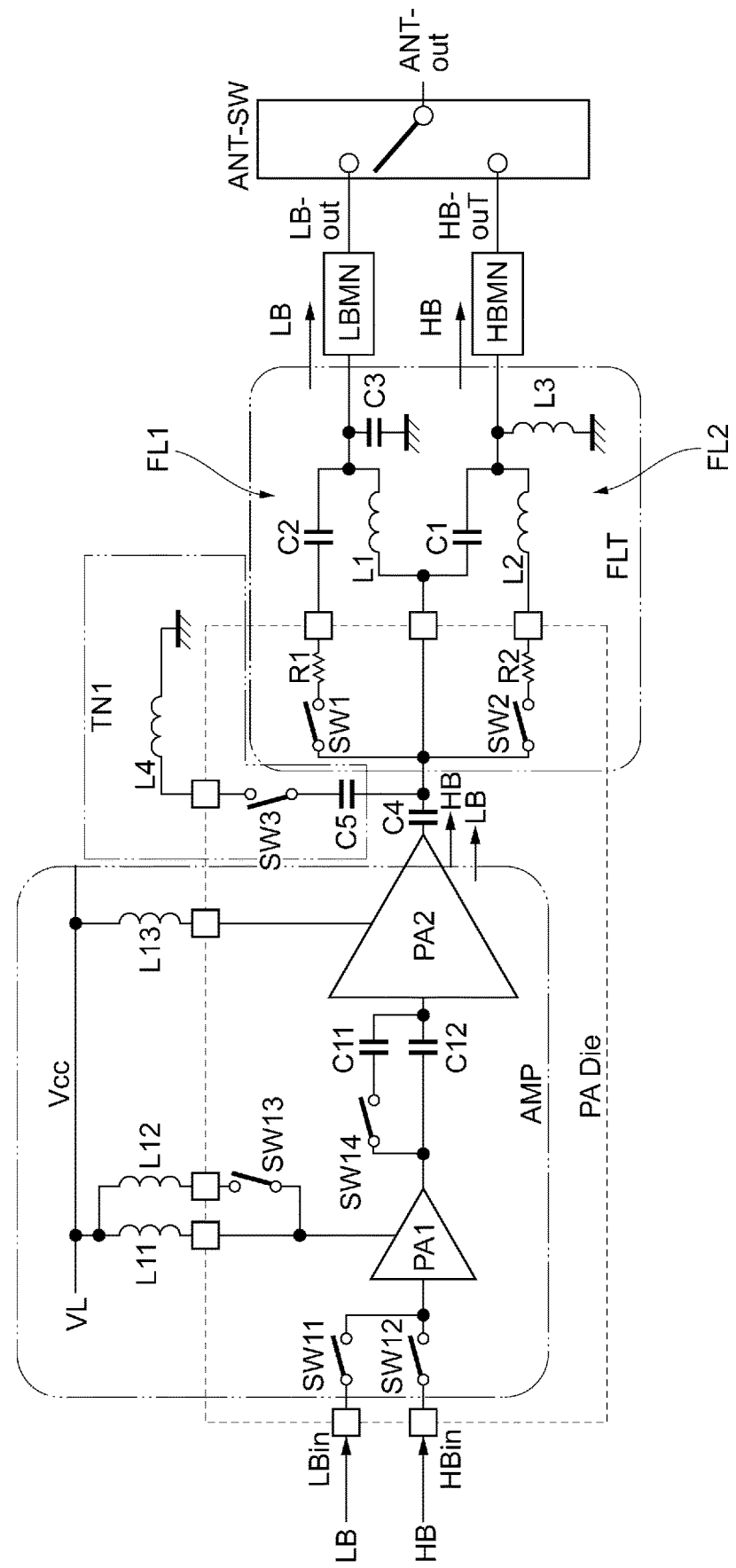
FIG. 11 is a schematic diagram illustrating the circuit configuration of a power amplifier circuit according to an eighth embodiment.

The configuration of a power amplifier circuit 8 according to an eighth embodiment of the disclosure will be described below with reference to FIG. 11. FIG. 11 is a schematic diagram illustrating the circuit configuration of the power amplifier circuit 8 according to the eighth embodiment.

The power amplifier circuit 8 is different from the power amplifier circuit 3 of the third embodiment in that it includes a resistor element R1 (first resistor element) and a resistor element R2 (second resistor element).

The resistor element R1 is disposed in the first filter FL1. The resistor element R1 is connected in series with the capacitor C2 and the switch SW1 and in parallel with the inductor L1. The quality (Q) factor of the LC parallel resonance circuit constituted by the inductor L1 and the capacitor C2 is thus decreased. This increases the frequency band to be attenuated by the band elimination filter HBR constituted by the inductor L1 and the capacitor C2. The resistor element R1 is connected between the switch SW1 and the capacitor C2. When the power amplifier circuit 8 amplifies the first signal LB, that is, when the switch SW1 is open, the first signal LB does not pass through the resistor element R1, and the loss of the first signal LB in the resistor element R1 is reduced.

The resistor element R2 is disposed in the second filter FL2. The resistor element R2 is connected in series with the inductor L2 and the switch SW2 and in parallel with the capacitor C1. The Q factor of the LC parallel resonance circuit constituted by the inductor L2 and the capacitor C1 is thus decreased. This increases the frequency band to be attenuated by the band elimination filter LBR constituted by the inductor L2 and the capacitor C1. The resistor element R2 is connected between the switch SW2 and the inductor L2. When the power amplifier circuit 8 amplifies the second signal HB, that is, when the switch SW2 is open, the second signal HB does not pass through the resistor element R2, and the loss of the second signal HB in the resistor element R2 is reduced.

Ninth Embodiment

Figure 12:
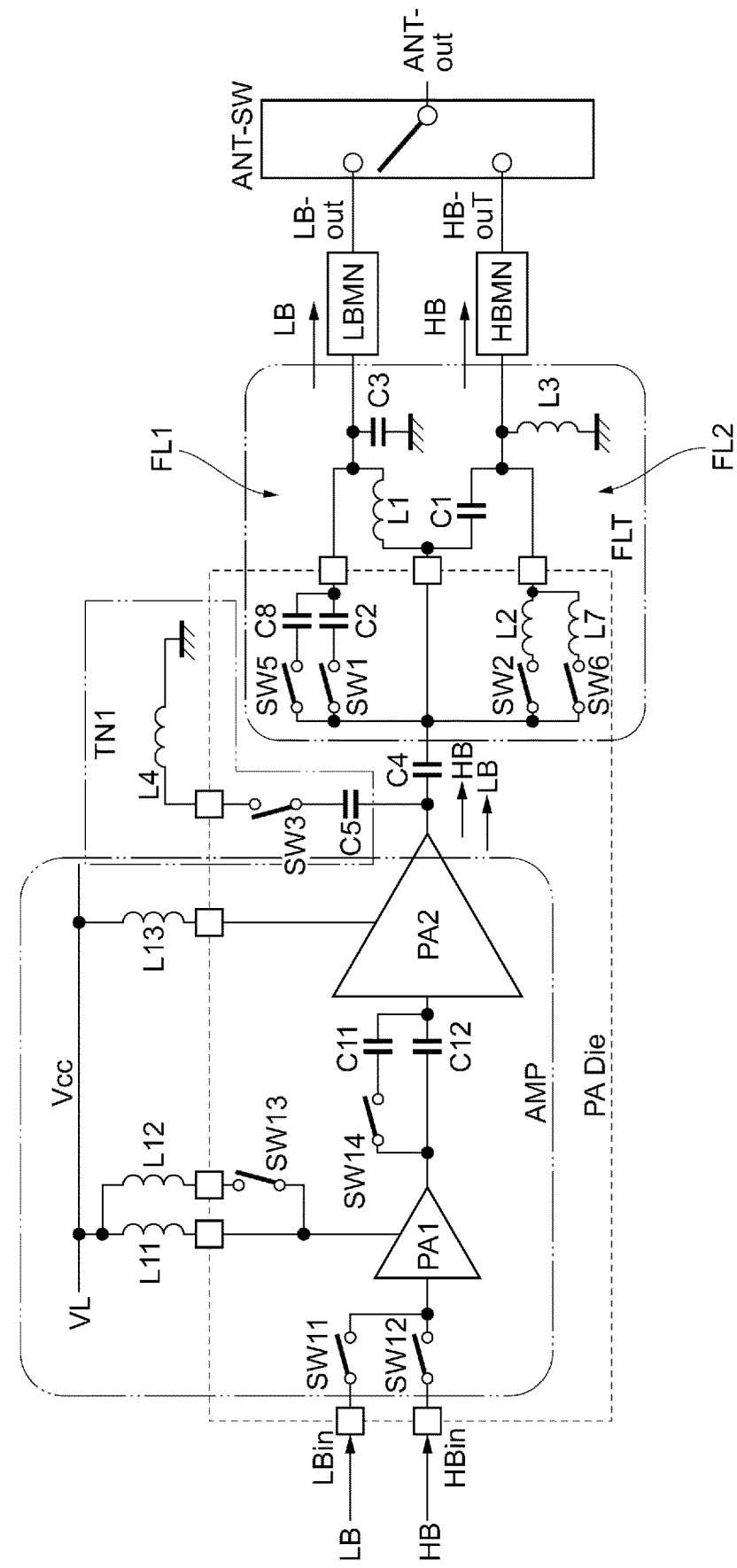
FIG. 12 is a schematic diagram illustrating the circuit configuration of a power amplifier circuit according to a ninth embodiment.

The configuration of a power amplifier circuit 9 according to a ninth embodiment of the disclosure will be described below with reference to FIG. 12. FIG. 12 is a schematic diagram illustrating the circuit configuration of the power amplifier circuit 9 according to the ninth embodiment.

The power amplifier circuit 9 is different from the power amplifier circuit 3 of the third embodiment in that it includes a capacitor C8 (eighth capacitor), an inductor L7 (seventh inductor), a switch SW5 (fifth switch), and a switch SW6 (sixth switch).

The capacitor C8 and the switch SW5 are disposed in the first filter FL1. The capacitor C8 and the switch SW5 are connected in series with each other and in parallel with the capacitor C2 and the switch SW1. It is thus possible to change the capacitance in the LC parallel resonance circuit of the first filter FL1. In other words, the LC parallel resonance circuit of the first filter FL1 can change the resonant frequency and accordingly enhance the attenuation efficiency for the second signal HB. That is, the power amplifier circuit 9 is able to reduce the second signal HB which may leak from the first output terminal LBout and also to reduce harmonics of the first signal LB which may leak from the first output terminal LBout.

The inductor L7 and the switch SW6 are disposed in the second filter FL2. The inductor L7 and the switch SW6 are connected in series with each other and in parallel with the inductor L2 and the switch SW2. It is thus possible to change the inductance in the LC parallel resonance circuit of the second filter FL2. In other words, the LC parallel resonance circuit of the second filter FL2 can change the resonant frequency and accordingly enhance the attenuation efficiency for the first signal LB. That is, the power amplifier circuit 9 is able to reduce the first signal LB which may leak from the second output terminal HBout.

Tenth Embodiment

Figure 13:
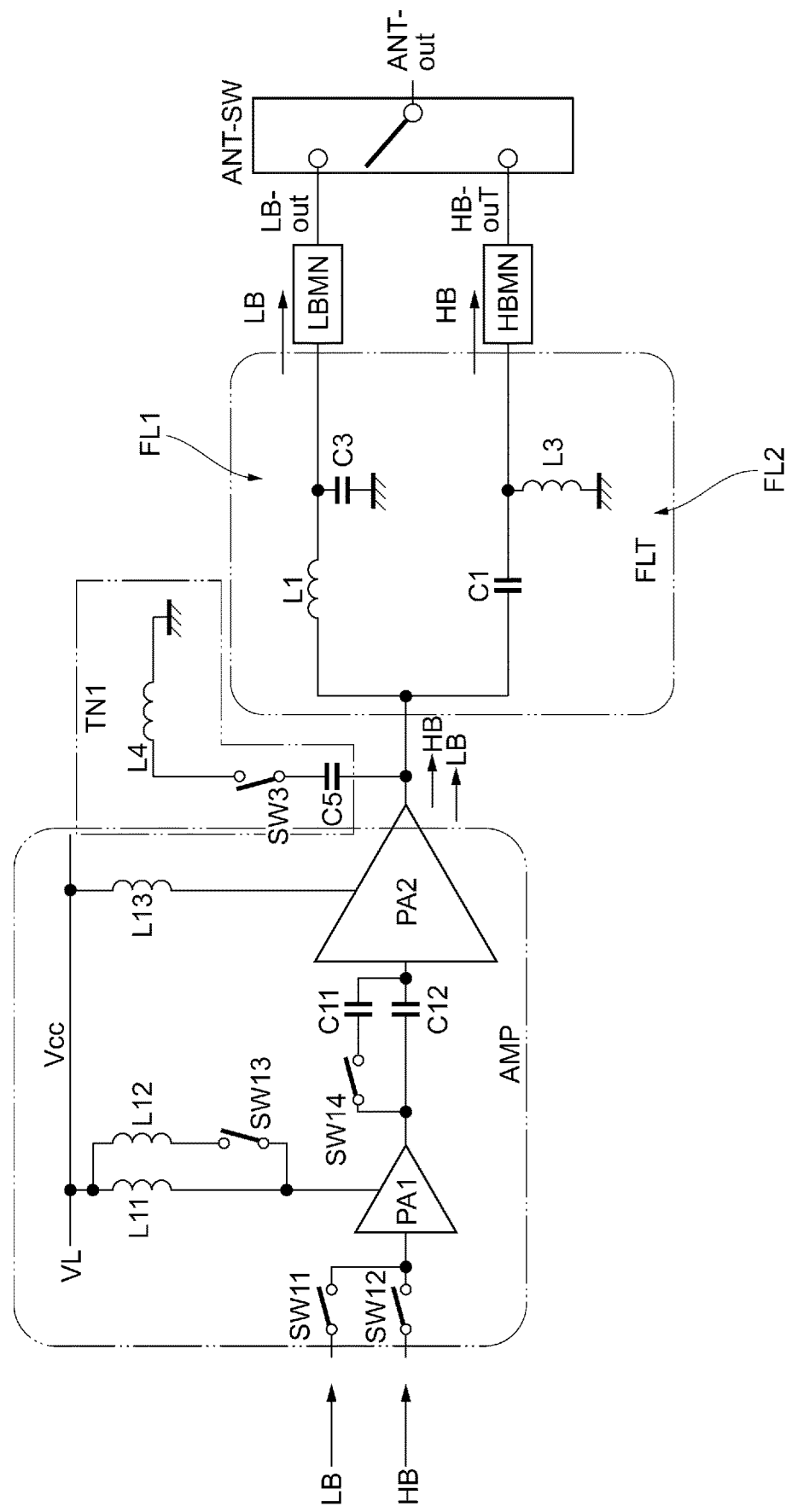
FIG. 13 is a schematic diagram illustrating the circuit configuration of a power amplifier circuit according to a tenth embodiment.

The configuration of a power amplifier circuit 10 according to a tenth embodiment of the disclosure will be described below with reference to FIG. 13. FIG. 13 is a schematic diagram illustrating the circuit configuration of the power amplifier circuit 10 according to the tenth embodiment.

The power amplifier circuit 10 is different from the power amplifier circuit 3 of the third embodiment in that it does not include the capacitor C2, the switch SW1, the inductor L2, the switch SW2, and the capacitor C4.

The first filter FL1 is a low pass filter constituted by the inductor L1 and the capacitor C3. The second filter FL2 is a high pass filter constituted by the capacitor C1 and the inductor L3. With this configuration, advantages similar to those of the third embodiment are also obtained.

Eleventh Embodiment

Figure 14:
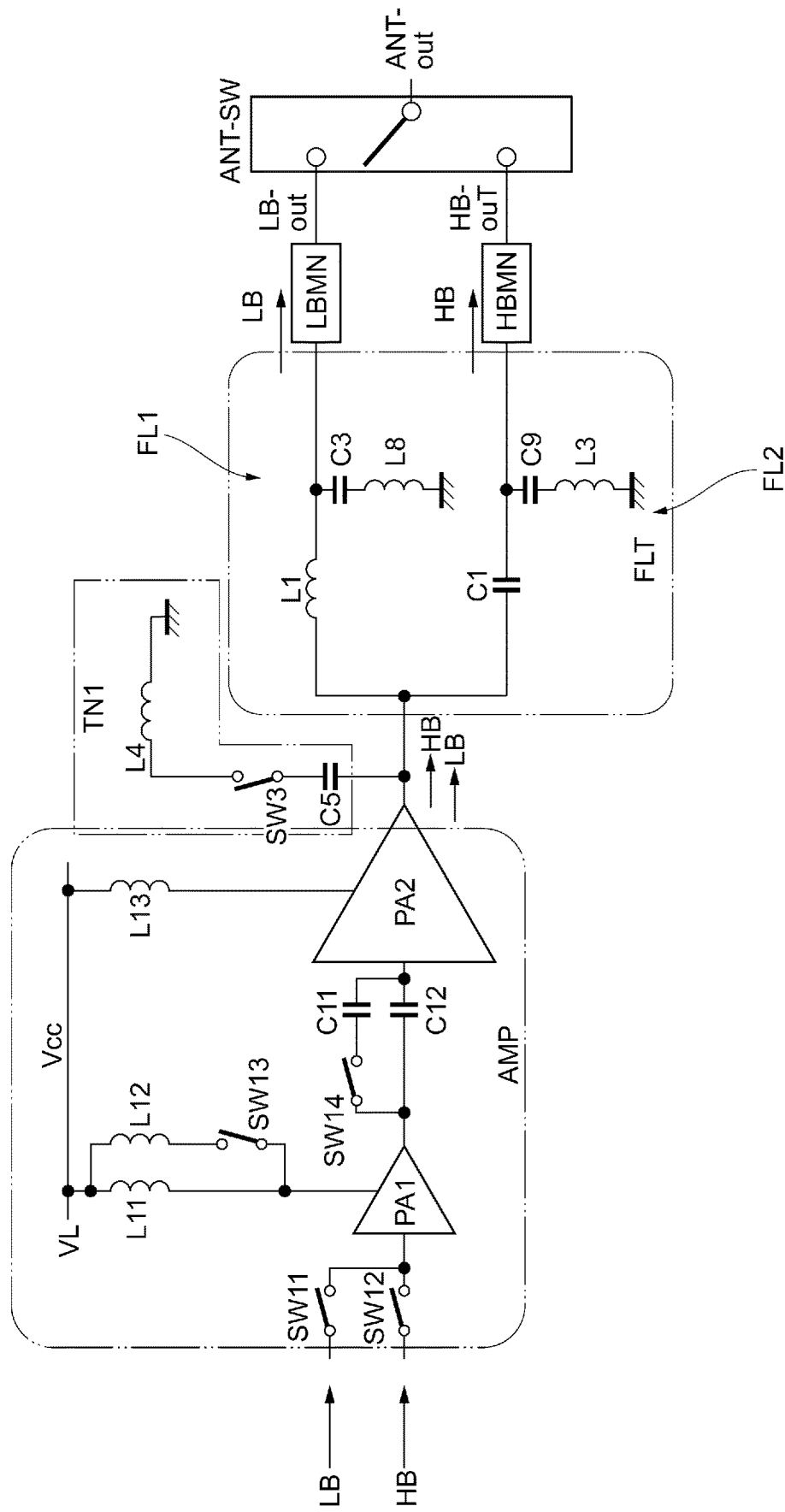
FIG. 14 is a schematic diagram illustrating the circuit configuration of a power amplifier circuit according to an eleventh embodiment.

The configuration of a power amplifier circuit 11 according to an eleventh embodiment of the disclosure will be described below with reference to FIG. 14. FIG. 14 is a schematic diagram illustrating the circuit configuration of the power amplifier circuit 11 according to the eleventh embodiment.

The power amplifier circuit 11 is different from the power amplifier circuit 10 of the tenth embodiment in that it includes an inductor L8 and a capacitor C9.

The inductor L8 is connected between the capacitor C3 and a ground. This can improve the attenuation efficiency for the second signal HB in the first filter FL1. That is, the power amplifier circuit 11 is able to reduce the second signal HB which may leak from the first output terminal LBout and also to reduce harmonics of the first signal LB which may leak from the first output terminal LBout.

The capacitor C9 is connected between the inductor L3 and the second output path for the second signal HB. This can improve the attenuation efficiency for the first signal LB in the second filter FL2. That is, the power amplifier circuit 11 is able to reduce the first signal LB which may leak from the second output terminal HBout.

Twelfth Embodiment

Figure 15:
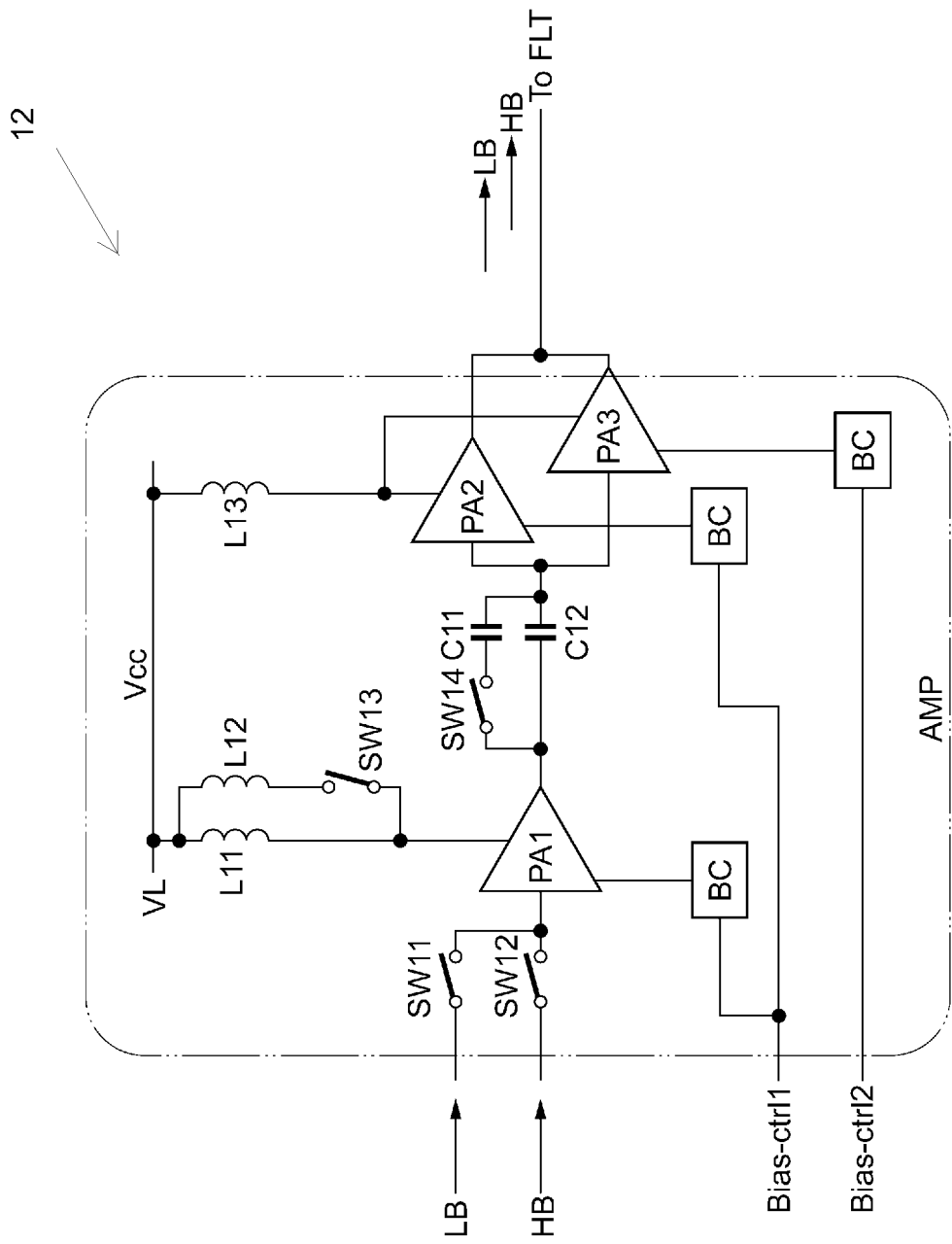
FIG. 15 is a schematic diagram illustrating the circuit configuration of a power amplifier unit of a power amplifier circuit according to a twelfth embodiment.

The configuration of a power amplifier circuit 12 according to a twelfth embodiment of the disclosure will be described below with reference to FIG. 15. FIG. 15 is a schematic diagram illustrating the circuit configuration of a power amplifier unit AMP of the power amplifier circuit 12 according to the twelfth embodiment.

In the power amplifier circuit 12, the portions other than the power amplifier unit AMP are similar to those of one of the first through eleventh embodiments and are not shown.

The output stage of the power amplifier unit AMP of the power amplifier circuit 12 includes second and third power amplifiers PA2 and PA3 connected in parallel with each other. A bias circuit BC is connected to each of the first, second, and third power amplifiers PA1, PA2, and PA3.

The type or the number of output-stage power amplifiers is switched according to whether the power amplifier circuit 12 is operated in a high power mode or a low power mode. When the power amplifier circuit 12 is operated in the high power mode, for example, the first power amplifier PA1 and the second and third power amplifiers PA2 and PA3 are turned ON. When the power amplifier circuit 12 is operated in the low power mode, for example, the first and second power amplifiers PA1 and PA2 are turned ON, while the third power amplifier PA3 is turned OFF. This can reduce the power consumption in the power amplifier unit AMP.

Thirteenth Embodiment

Figure 16:
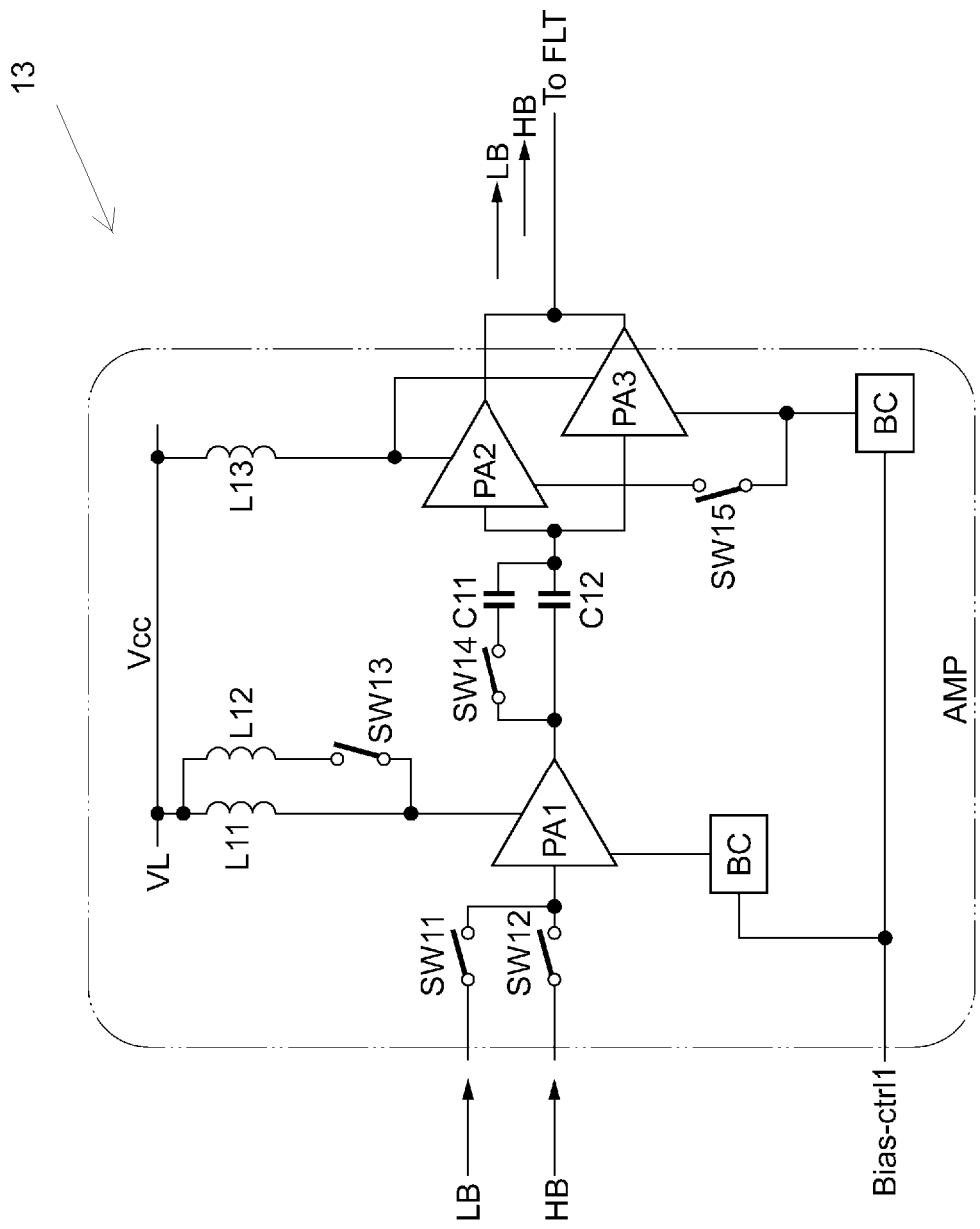
FIG. 16 is a schematic diagram illustrating the circuit configuration of a power amplifier unit of a power amplifier circuit according to a thirteenth embodiment.

The configuration of a power amplifier circuit 13 according to a thirteenth embodiment of the disclosure will be described below with reference to FIG. 16. FIG. 16 is a schematic diagram illustrating the circuit configuration of a power amplifier unit AMP of the power amplifier circuit 13 according to the thirteenth embodiment.

The power amplifier unit AMP of the power amplifier circuit 13 is different from that of the power amplifier circuit 12 of the twelfth embodiment in that a switch SW15 is provided to connect and disconnect the second power amplifier PA2 to and from the bias circuit BC connected to the third power amplifier PA3. With this configuration, advantages similar to those of the twelfth embodiment are also obtained.

In the twelfth and thirteenth embodiments, the output stage of the power amplifier unit AMP is constituted by plural power amplifiers. Alternatively, the driver stage of the power amplifier unit AMP may be constituted by plural power amplifiers.

Fourteenth Embodiment

Figure 17:
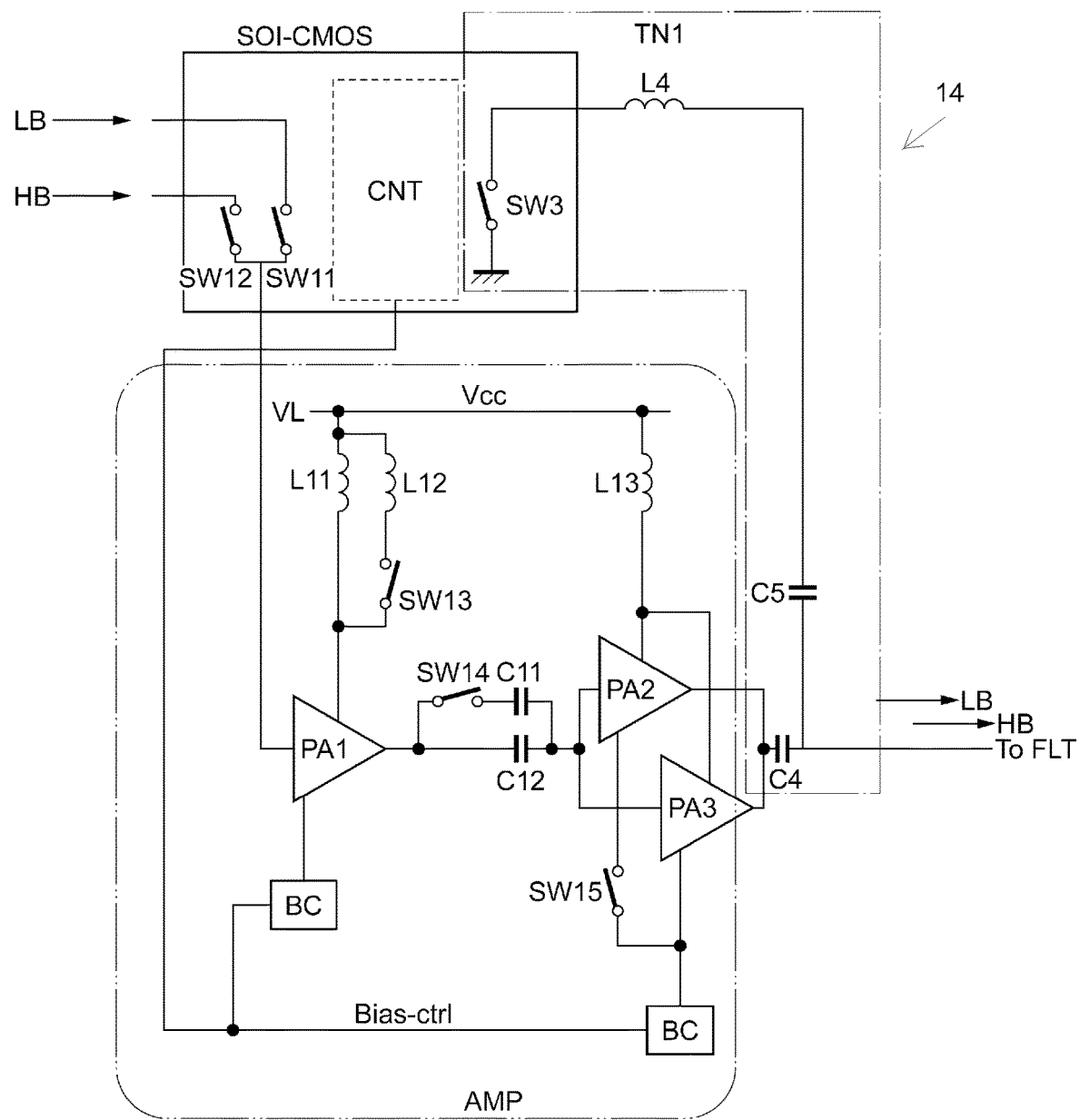
FIG. 17 is a schematic diagram illustrating the circuit configuration of a power amplifier unit and a harmonics terminator of a power amplifier circuit according to a fourteenth embodiment.

The configuration of a power amplifier circuit 14 according to a fourteenth embodiment of the disclosure will be described below with reference to FIG. 17. FIG. 17 is a schematic diagram illustrating the circuit configuration of a power amplifier unit AMP and a first harmonics terminator TN1 of the power amplifier circuit 14 according to the fourteenth embodiment.

The power amplifier circuit 14 includes a first harmonics terminator TN1, and the switches SW11, SW12, and SW3 are formed in silicon-on-insulator—complementary-metal-oxide (SOI-CMOS) device. A controller CNT for the bias circuit BC is disposed between the switches SW11 and SW12 and the switch SW13. With this configuration, the power amplifier circuit 14 enhances the isolation between the switch SW11 and the switch SW3 and between the switch SW12 and the switch SW3 in the SOI-CMOS device. This can stop an RF signal outputted from the first power amplifier PA1 from returning to the first power amplifier PA1. The power amplifier circuit 14 can thus reduce oscillation in the first, second, and third power amplifiers PA1, PA2, and PA3. The power amplifier circuit 14 can also reduce noise. The controller CNT may be disposed at a position other than the position between the switch SW13 and the switches SW11 and SW12, provided that it is disposed between a switch connected to each of the input terminals of the first, second, and third power amplifiers PA1, PA2, and PA3 and a switch connected to each of the output terminals thereof. For example, the controller CNT may be disposed between the switches SW11 and SW14 or between the switches SW14 and SW3.

Fifteenth Embodiment

Figure 18:
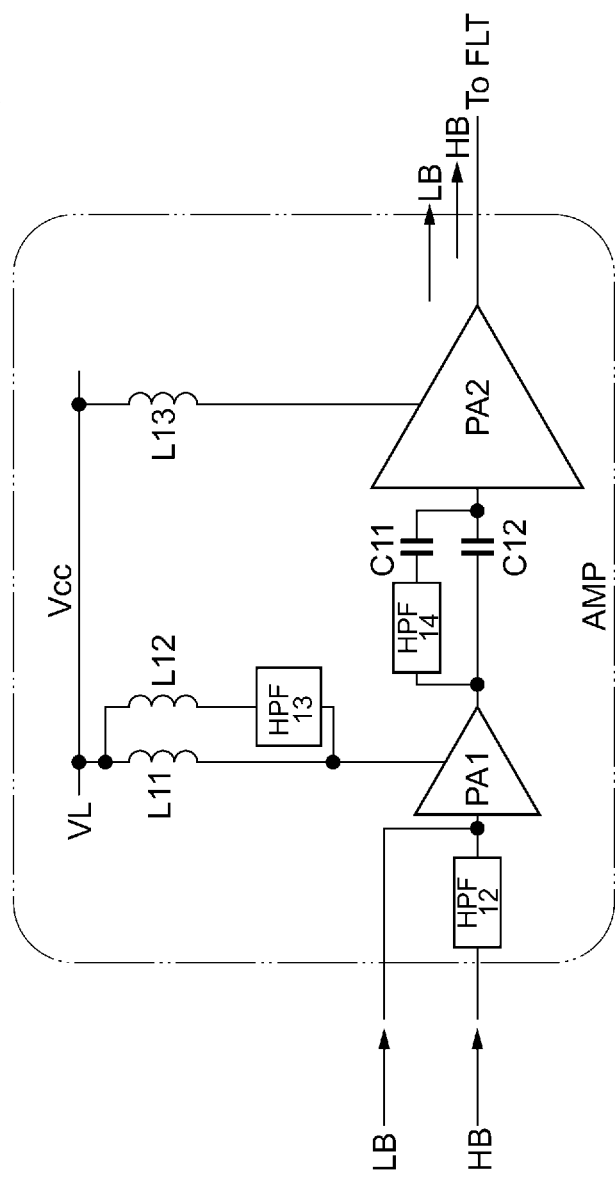
FIG. 18 is a schematic diagram illustrating the circuit configuration of a power amplifier unit of a power amplifier circuit according to a fifteenth embodiment.

The configuration of a power amplifier circuit 15 according to a fifteenth embodiment of the disclosure will be described below with reference to FIG. 18. FIG. 18 is a schematic diagram illustrating the circuit configuration of a power amplifier unit AMP of the power amplifier circuit 15 according to the fifteenth embodiment.

In the power amplifier unit AMP of the power amplifier circuit 15, switches are replaced by high pass filters. More specifically, a high pass filter HPF12 is disposed instead of the switch SW12, a high pass filter HPF13 is disposed instead of the switch SW13, and a high pass filter HPF14 is disposed instead of the switch SW14. With this configuration, advantages similar to those of the above-described embodiments are also obtained.

Sixteenth Embodiment

Figure 19:
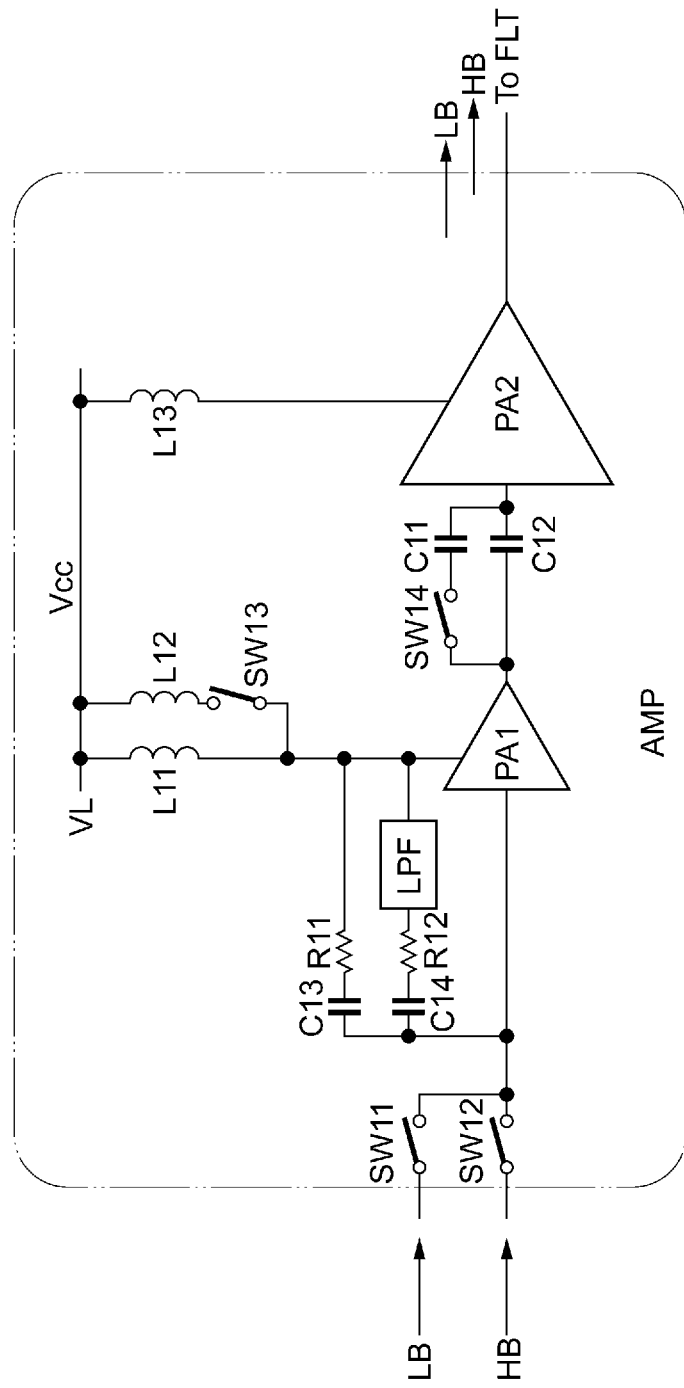
FIG. 19 is a schematic diagram illustrating the circuit configuration of a power amplifier unit of a power amplifier circuit according to a sixteenth embodiment.

The configuration of a power amplifier circuit 16 according to a sixteenth embodiment of the disclosure will be described below with reference to FIG. 19. FIG. 19 is a schematic diagram illustrating the circuit configuration of a power amplifier unit AMP of the power amplifier circuit 16 according to the sixteenth embodiment.

The power amplifier unit AMP of the power amplifier circuit 16 includes a feedback circuit. More specifically, resistor elements R11 and R12, capacitors C13 and C14, and a low pass filter LPF are provided between a path which connects the power supply line VL and the first power amplifier PA1 and a path through which the first signal LB or the second signal HB is outputted to the first power amplifier PA1. The resistor element R11 and the capacitor C13 are connected in series with each other. The resistor element R12, the capacitor C14, and the low pass filter LPF are connected in series with each other and in parallel with the resistor element R11 and the capacitor 13. This configuration makes it possible to adjust the feedback amount in accordance with whether the first signal LB or the second signal HB is amplified. The type of the filter connected to the resistor element R12 and the capacitor C14 is not restricted to a low pass filter LPF, and a high pass filter may alternatively be connected if it is possible to adjust the feedback amount.

According to an aspect of the disclosure, there is provided a power amplifier circuit including a power amplifier PA2, first and second filters FL1 and FL2, and first and second output paths. The power amplifier PA2 is able to amplify both of a first signal LB and a second signal HB. The frequency of the second signal HB is higher than that of the first signal LB. The first filter FL1 includes a first inductor L1 and attenuates the second signal HB amplified in the power amplifier PA2. The first inductor L1 serves as a path for the first signal LB amplified in the power amplifier PA2. The second filter FL2 includes a first capacitor C1 and attenuates the first signal LB amplified in the power amplifier PA2. The first capacitor C1 serves as a path for the second signal HB amplified in the power amplifier PA2. The first signal LB outputted from the first filter FL1 is supplied to the first output path. The second signal HB outputted from the second filter FL2 is supplied to the second output path.

According to this aspect, the first signal LB having a lower frequency than the second signal HB is outputted via the first inductor L1 as the path. The loss of the first signal LB is thus reduced. The second signal HB having a higher frequency than the first signal LB is outputted via the first capacitor C1 as the path. The loss of the second signal HB is thus reduced. The power amplifier circuit is capable of amplifying two signals (first signal LB and second signal HB) by using only one power amplifier unit, so that the area of the power amplifier circuit can be reduced. In the power amplifier circuit, no switches are disposed in the transmit path for the first signal LB outputted from the second power amplifier PA2, while no switches are disposed in the transmit path for the second signal HB outputted from the second power amplifier PA2. This configuration makes it possible to decrease the area of the power amplifier circuit and also to reduce the loss of the first signal LB and the second signal HB.

The first filter FL1 may further include a second capacitor C2 connected in parallel with the first inductor L1. The second filter FL2 may further include a second inductor L2 connected in parallel with the first capacitor C1. The first inductor L1 and the second capacitor C2 form an LC parallel resonance circuit in the first filter FL1, thereby improving the attenuation efficiency for the second signal HB. The second inductor L2 and the first capacitor C1 form an LC parallel resonance circuit in the second filter FL2, thereby improving the attenuation efficiency for the first signal LB.

The inductance of the second inductor L2 may be greater than that of the first inductor L1. This decreases the frequency bandwidth of signals to be attenuated in the band elimination filter of the second filter FL2. That is, the power amplifier circuit is able to reduce the loss of the second signal HB in the second filter FL2.

The capacitance of the second capacitor C2 may be smaller than that of the first capacitor C1. This decreases the frequency bandwidth of signals to be attenuated in the band elimination filter of the first filter FL1. That is, the power amplifier circuit is able to reduce the loss of the first signal LB in the first filter FL1.

The first filter FL1 may further include a third capacitor C3 connected between the first output path and a ground. With this configuration, harmonics outputted from the second power amplifier PA2 are attenuated by a low pass filter constituted by the first inductor L1 and the third capacitor C3. The power amplifier circuit is thus able to reduce a leakage of harmonics from the first output terminal. The first filter FL1 has the function of performing impedance matching between the second power amplifier PA2 and the first output terminal, as well as the function as a low pass filter.

The second filter FL2 may further include a third inductor L3 connected between the second output path and a ground. With this configuration, the second filter FL2 is able to conduct impedance matching between the second power amplifier PA2 and the second output terminal.

The capacitance of the third capacitor C3 may be greater than that of the first capacitor C1. This decreases the frequency bandwidth of signals that are allowed to pass through a low pass filter constituted by the first inductor L1 and the third capacitor C3. That is, the power amplifier circuit is able to decrease a leakage of RF signals of undesirable frequencies and to reduce noise.

The inductance of the third inductor L3 may be smaller than that of the first inductor L1. This decreases the frequency bandwidth of signals that are allowed to pass through a high pass filter constituted by the first capacitor C1 and the third inductor L3. That is, the power amplifier circuit is able to decrease a leakage of RF signals of undesirable frequencies and to reduce noise.

The first filter FL1 may further include a first switch SW1 connected in series with the second capacitor C2. The first switch SW1 is not connected to the first inductor L1, which serves as the main path for the first signal LB, but is connected in series with the second capacitor C2 which forms the LC parallel resonance circuit with the first inductor L1. The first switch SW1 is turned ON during the HB operation for amplifying the second signal HB, and is turned OFF during the LB operation for amplifying the first signal LB. That is, during the LB operation, the first switch SW1 is open and can thus be formed in a small size.

The second filter FL2 may further include a second switch SW2 connected in series with the second inductor L2. The second switch SW2 is not connected to the first capacitor C1, which serves as the main path for the second signal HB, but is connected in series with the second inductor L2 which forms the LC parallel resonance circuit with the first capacitor C1. That is, during the HB operation, the second switch SW2 is open and can thus be formed in a small size.

The power amplifier circuit may further include a fourth capacitor C4 connected between the power amplifier PA2 and the second filter FL2. The fourth capacitor C4 can block a DC voltage of a signal outputted from the second power amplifier PA2. The first and second switches SW1 and SW2 can thus allow high-amplitude RF signals to pass therethrough.

The power amplifier circuit may further include an output switch ANT-SW. The output switch ANT-SW outputs one of the first signal LB supplied to the first output path and the second signal HB supplied to the second output path. When outputting the first signal LB, the antenna switch ANT-SW electrically disconnects the second output terminal from an antenna terminal. When outputting the second signal HB, the antenna switch ANT-SW electrically disconnects the first output terminal from the antenna terminal. The power amplifier circuit is thus able to reduce harmonics of the first signal LB which may leak via the second output terminal when amplifying the first signal LB.

The power amplifier circuit may further include a first harmonics terminator TN1. The first harmonics terminator TN1 is connected between a ground and a path between the power amplifier PA2 and the second filter FL2 and attenuates harmonics of the first signal LB or those of the second signal HB. The power amplifier circuit is thus able to reduce harmonics of the first signal LB which may leak from the second output terminal when amplifying the first signal LB.

The first harmonics terminator TN1 may include a fifth capacitor C5, a fourth inductor L4 connected to the fifth capacitor C5, and a third switch SW3 connected between the fifth capacitor C5 and a ground. The fifth capacitor C5 can block a DC voltage, and the third switch SW3 accordingly allows high-amplitude RF signals to pass therethrough.

The power amplifier circuit may further include a first harmonics terminator TN1. The first harmonics terminator TN1 is connected between a ground and a path between the fourth capacitor C4 and the second filter FL2 and attenuates harmonics of the first signal LB or those of the second signal HB. The first harmonics terminator TN1 may include a fifth capacitor C5, a fourth inductor L4 connected to the fifth capacitor C5, and a third switch SW3 connected to the fifth capacitor C5. The fourth capacitor C4 can block a DC voltage, and the third switch SW3 accordingly allows high-amplitude RF signals to pass therethrough. In other words, the fifth capacitor C5 may not necessarily be used for blocking a DC voltage to be applied to the third switch SW3, thereby increasing the flexibility in disposing the elements in the first harmonics terminator TN1.

The first harmonics terminator TN1 may further include a sixth capacitor C6 connected in parallel with the fifth capacitor C5. The first harmonics terminator TN1 is able to switch the capacitance by using the third switch SW3 so as to change the resonant frequency. It is thus possible to increase the attenuation of harmonics of the first signal LB and those of the second signal HB in the first harmonics terminator TN1.

The first harmonics terminator TN1 may further include a fifth inductor L5 connected in parallel with the fourth inductor L4. The first harmonics terminator TN1 is able to switch the inductance by using the third switch SW3 so as to change the resonant frequency. It is thus possible to increase the attenuation of harmonics of the first signal LB and those of the second signal HB in the first harmonics terminator TN1.

The power amplifier circuit may further include a second harmonics terminator TN2. The second harmonics terminator TN2 includes a fourth switch SW4, a seventh capacitor C7, and a sixth inductor C6 that are connected between the second output path and a ground, and attenuates harmonics of the first signal LB. The second harmonics terminator TN2 attenuates harmonics of the first signal LB or those of the second signal HB produced in the power amplifier unit. The power amplifier circuit is thus able to reduce harmonics of the first signal LB which may leak from the second output terminal when amplifying the first signal LB.

The first filter FL1 may further include a first resistor element R1 connected in series with the second capacitor C2. The Q factor of the LC parallel resonance circuit constituted by the first inductor L1 and the second capacitor C2 is thus decreased. This increases the frequency band to be attenuated by the band elimination filter constituted by the first inductor L1 and the second capacitor C2.

The second filter FL2 may further include a second resistor element R2 connected in series with the second inductor L2. The Q factor of the LC parallel resonance circuit constituted by the second inductor L2 and the first capacitor C1 is thus decreased. This increases the frequency band to be attenuated by the band elimination filter constituted by the second inductor L2 and the first capacitor C1.

The first filter FL1 may further include an eighth capacitor C8 connected in parallel with the second capacitor C2. This configuration makes it possible to change the capacitance in the LC parallel resonance circuit of the first filter FL1. That is, the power amplifier circuit is able to change the resonant frequency of the LC parallel resonance circuit of the first filter FL1 and accordingly to enhance the attenuation efficiency for the second signal HB.

The second filter FL2 may further include a seventh inductor L7 connected in parallel with the second inductor L2. This configuration makes it possible to change the inductance in the LC parallel resonance circuit of the second filter FL2. That is, the power amplifier circuit is able to change the resonant frequency of the LC parallel resonance circuit of the second filter FL2 and accordingly to enhance the attenuation efficiency for the first signal LB.

The power amplifier circuit may further include a first matching circuit. The first matching circuit is connected to the first output path and attenuates the second signal HB. The first matching circuit is able to attenuate the second signal HB which has not been sufficiently attenuated in the first filter FL1 and leaked to the first output path, thereby reducing a leakage of the second signal HB from the first output terminal. If the frequency band of harmonics of the first signal LB is a band that can pass through the first filter FL1, the first matching circuit may also attenuate the harmonics of the first signal LB.

The power amplifier circuit may further include a second matching circuit. The second matching circuit is connected to the second output path and attenuates harmonics of the first signal LB. Even if the frequency band of the harmonics of the first signal LB is a band that can pass through the second filter FL2, the second matching circuit can attenuate the harmonics of the first signal LB, thereby reducing a leakage of the harmonics of the first signal LB from the second output terminal. The second matching circuit may have the function of attenuating the first signal LB.

As described above, according to an aspect of the disclosure, it is possible to provide a power amplifier circuit that is less likely to decrease the power gain.

The above-described embodiments are provided for facilitating the understanding of the disclosure, but are not intended to be exhaustive or to limit the disclosure to the precise forms disclosed. Modifications and/or improvements may be made without departing from the scope and spirit of the disclosure, and equivalents of the disclosure are also encompassed in the disclosure. That is, suitable design changes made to the embodiments by those skilled in the art are also encompassed in the disclosure within the scope and spirit of the disclosure. For example, the elements of the embodiments and the positions, materials, conditions, configurations, and sizes thereof are not restricted to those described in the embodiments and may be changed in an appropriate manner. The configurations described in some of the embodiments may partially be replaced by or combined with each other, and configurations obtained by combining the configurations of the embodiments are also encompassed in the disclosure within the scope and spirit of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
   a power amplifier configured to amplify a first signal and a second signal, a frequency of the second signal being higher than a frequency of the first signal;
   a first matching network;
   a first filter comprising a first inductor, wherein the first filter is configured to attenuate the second signal amplified by the power amplifier, the first inductor serves as a signal path for the first signal amplified by the power amplifier, and the first inductor is connected between an output of the power amplifier and the first matching network;
   a second matching network;
   a second filter comprising a first capacitor, wherein the second filter is configured to attenuate the first signal amplified by the power amplifier, the first capacitor serves as a signal path for the second signal amplified by the power amplifier, and the first capacitor is connected between the output of the power amplifier and the second matching network;
   a first output path to which the first signal is supplied from the first filter; and
   a second output path to which the second signal is supplied from the second filter.

2. The power amplifier circuit according to claim 1, wherein:
   the first filter further comprises a second capacitor connected in parallel with the first inductor; and
   the second filter further comprises a second inductor connected in parallel with the first capacitor.

3. The power amplifier circuit according to claim 2, wherein an inductance of the second inductor is greater than an inductance of the first inductor.

4. The power amplifier circuit according to claim 2, wherein a capacitance of the second capacitor is less than a capacitance of the first capacitor.

5. The power amplifier circuit according to claim 1, wherein the first filter further comprises a third capacitor connected between the first output path and a ground.

6. The power amplifier circuit according to claim 1, wherein the second filter further comprises a third inductor connected between the second output path and a ground.

7. The power amplifier circuit according to claim 5, wherein a capacitance of the third capacitor is greater than a capacitance of the first capacitor.

8. The power amplifier circuit according to claim 2, wherein the first filter further comprises a first switch connected in series with the second capacitor.

9. The power amplifier circuit according to claim 2, wherein the second filter further comprises a second switch connected in series with the second inductor.

10. The power amplifier circuit according to claim 1, further comprising:
    a fourth capacitor that is connected between the power amplifier and the second filter.

11. The power amplifier circuit according to claim 1, further comprising:
    a first harmonic termination circuit that is connected between ground and a signal path between the power amplifier and the second filter, the first harmonic termination circuit being configured to attenuate harmonics of the first signal or harmonics of the second signal.

12. The power amplifier circuit according to claim 11, wherein the first harmonic termination circuit comprises:
    a fifth capacitor,
    a fourth inductor, and
    a third switch, wherein the fifth capacitor, the fourth inductor, and the third switch are connected in series between ground and the signal path between the power amplifier and the second filter.

13. The power amplifier circuit according to claim 10, further comprising:
    a first harmonic termination circuit that is connected between ground and a path between the fourth capacitor and the second filter, the first harmonic termination circuit being configured to attenuate harmonics of the first signal or harmonics of the second signal,
    wherein the first harmonic termination circuit comprises:
    a fifth capacitor,
    a fourth inductor, and
    a third switch, wherein the fifth capacitor, the fourth inductor, and the third switch are connected in series between ground and the signal path between the fourth capacitor and the second filter.

14. The power amplifier circuit according to claim 12, wherein the first harmonic termination circuit further comprises a sixth capacitor connected in parallel with the fifth capacitor.

15. The power amplifier circuit according to claim 12, wherein the first harmonic termination circuit further comprises a fifth inductor connected in parallel with the fourth inductor.

16. The power amplifier circuit according to claim 1, further comprising:
- a second harmonic termination circuit comprising a fourth switch, a seventh capacitor, and a sixth inductor, the second harmonic termination circuit being configured to attenuate harmonics of the first signal,
- wherein the fourth switch, the seventh capacitor, and the sixth inductor are connected between the second output path and ground.

17. The power amplifier circuit according to claim 2, wherein the first filter further comprises a first resistor element connected in series with the second capacitor.

18. The power amplifier circuit according to claim 2, wherein the second filter further comprises a second resistor element connected in series with the second inductor.

19. The power amplifier circuit according to claim 2, wherein the first filter further comprises an eighth capacitor connected in parallel with the second capacitor.

20. The power amplifier circuit according to claim 2, wherein the second filter further comprises a seventh inductor connected in parallel with the second inductor.

* * * * *